United States Patent [19]
Fukumoto

[11] Patent Number: 5,488,587
[45] Date of Patent: Jan. 30, 1996

[54] NON-VOLATILE DYNAMIC RANDOM ACCESS MEMORY

[75] Inventor: Katsumi Fukumoto, Nara, Japan

[73] Assignee: Sharp Kabushiki Kaisha, Osaka, Japan

[21] Appl. No.: 325,957

[22] Filed: Oct. 20, 1994

[30] Foreign Application Priority Data

Oct. 20, 1993 [JP] Japan .................................. 5-262648
Jan. 28, 1994 [JP] Japan .................................. 6-008795

[51] Int. Cl.$^6$ .................................................. G11C 7/00
[52] U.S. Cl. ........................................ 365/222; 365/228
[58] Field of Search ............................... 365/222, 233.5, 365/233, 145, 228, 185

[56] References Cited

U.S. PATENT DOCUMENTS

| | | | |
|---|---|---|---|
| 4,747,082 | 5/1988 | Minato et al. | 365/222 |
| 4,827,453 | 5/1989 | Sawada et al. | 365/222 |
| 5,189,641 | 2/1993 | Arakawa | 365/190 |
| 5,197,026 | 3/1993 | Butter | 365/222 |
| 5,396,461 | 3/1995 | Fukumoto | 365/189.01 |

FOREIGN PATENT DOCUMENTS

3-5996  1/1991  Japan.
6-176589  6/1994  Japan.

OTHER PUBLICATIONS

Fukumoto, K., et al., "A 256K-bit non-volatile PSRAM with page recall and chip store" *1991 Symposium on VLSI Circuits, Digest of Technical Papers* (May 30–Jun. 1, 1991) pp. 91–92.

Evans, J. T., et al., "An experimental 512-bit nonvolatile memory with ferroelectric storage cell" *IEEE J. Solid–State Circuits* (1988) 23(25):1171–1175.

Moazzami, R., et al., "A ferroelectric DRAM cell for high-density NVRAM's" *IEEE Electron Device Lett.* (1990) 11(10):454–456.

*Primary Examiner*—A. Zarabian
*Attorney, Agent, or Firm*—Morrison & Foerster

[57] ABSTRACT

The presently claimed NVDRAM including: volatile memory cells which require a refreshing operation; non-volatile memory cells; an address generation circuit for automatically generating in sequence respective addresses; a self-refresh circuit; a refresh timing circuit; a self-store starting circuit for determining whether the duration of the refreshing operation as measured by the refresh timing circuit has exceeded the predetermined time amount; a self-store circuit for, when the duration of the refreshing operation has exceeded the predetermined time amount, stopping the refreshing operation as measured by the refresh timing circuit and for sequentially transferring the content stored in the volatile memory cells to the non-volatile memory cells to be stored therein based on the addresses generated by the address generation circuit.

20 Claims, 18 Drawing Sheets

STORE - MODE
IN THE CASE WHERE THE DATA IS "0"

STORE - MODE
IN THE CASE WHERE THE DATA IS "1"

RECALL - MODE

NON-VOLATILE DYNAMIC RANDOM ACCESS MEMORY

BACKGROUND OF THE INVENTION

1. Field of the Invention

The present invention relates to a Non-Volatile Dynamic Random Access Memory (hereinafter referred to as "NVDRAM") in which a Dynamic Random Access Memory (hereinafter referred to as "DRAM") and an Electrically Erasable Programmable Read-Only Memory (hereinafter referred to as "EEPROM") are used in combination, and to an NVDRAM in which a ferroelectric material is used.

2. Description of the Related Art

Conventional NVDRAMs may be categorized into two types. One is NVDRAMs in which a DRAM, which is a volatile semiconductor memory device, and an EEPROM, which is a non-volatile semiconductor memory device, are used in combination (hereinafter, this type of NVDRAM will be referred to as a "DRAM/EEPROM type NVDRAM"). The other is NVDRAMs in which memory cells composed of a ferroelectric material are used so as to function both as volatile memory devices and as non-volatile memory devices (hereinafter, this type of NVDRAM will be referred to as a "ferroelectric type NVDRAM").

A detailed description of DRAM/EEPROM type NVDRAMs can be found in "A 256k-bit Non-Volatile PSRAM with Page Recall and Chip Store", 1991 Sym. VLSI circuit Dig. Tech. papers, May, pp. 91–92. This NVDRAM operates in a DRAM-mode and a store-mode. Specifically, during usual operations, a DRAM including volatile memory cells is accessed in a DRAM-mode. On the other hand, immediately before the NVDRAM is turned off, the data stored in the DRAM is saved in an EEPROM including non-volatile memory cells. As a result, high-speed accesses to the volatile DRAM can be realized during usual operations, while allowing the data stored in the DRAM to be stored in the EEPROM before the NVDRAM is turned off, so as to be retained therein. The data stored in the non-volatile EEPROM can be read back into the DRAM in a recall-mode.

A description of a ferroelectric type NVDRAM can be found in the following documents: (1) "An Experimental 512-bit Non-Volatile Memory with Ferroelectric Storage Cell" IEEE Journal of Solid State Circuits, vol. 23, pp. 1171–1175, October, 1988; and (2) "A Ferroelectric DRAM cell for High-Density NVDRAM's", IEEE Electron Device Lett., vol. 11, pp. 454–456, October, 1990.

The above-mentioned ferroelectric type NVDRAM includes memory cells each incorporating a capacitor element in which a ferroelectric material thin film having a perovskite type crystal structure, e.g. Y1, (a newly developed ferroelectric ceramic having a relatively small deterioration due to rewriting commonly referred to by the same name; the composition thereof is yet to be published), PZT (PbZrTiO$_3$, or lead zirconate titanate), PLZT (PbLaZrTiO$_3$), PbTiO$_3$, etc. is interposed.

When an a.c. current is applied to the above-mentioned capacitor element, the polarization state of the ferroelectric material interposed in the capacitor element shows hysteresis characteristics shown in FIG. 1. As seen from FIG. 1, the polarization state of the ferroelectric material, which is at point A when it is not polarized, shifts to point B when a positive electric field is applied to the ferroelectric material. The polarization state of the ferroelectric material returns only to point C (instead of A) when the electric field is removed, thus resulting in a positive remanent polarization. This remanent polarization vanishes when a negative anti-electric field is applied. By further increasing the intensity of the negative electric field, the polarization state of the ferroelectric material is inverted so as to shift to point D. The polarization state of the ferroelectric material returns only to point E when the electric field is again removed, thus resulting in a negative remanent polarization.

Thus, by allowing the polarization state of the ferroelectric material to be inverted so as to achieve positive or negative remanent polarization, given data can be stored in a non-volatile manner. Moreover, by simply applying or removing a positive or negative electric field, it can be ensured that the polarization state of the ferroelectric material of the above-mentioned capacitor element shifts only between points B and C or between points D and E, instead of having polarization inversions. Thus, given data can be stored in a volatile manner, as in the case of a usual DRAM. However, in order to retain the data thus stored in a volatile manner, a refreshing operation is required as in the case of a DRAM.

A ferroelectric type NVDRAM has the advantage that, since the memory cells thereof can be constituted by a smaller number of elements than in the case of a DRAM/EEPROM type NVDRAM, the cell areas can be reduced, thereby providing for further integration of the device. On the other hand, a DRAM/EEPROM type NVDRAM has the advantage that different data can be stored in the DRAM and the EEPROM included in the NVDRAM.

The structure and operation of a DRAM/EEPROM type NVDRAM are well known, and descriptions thereof can be found in the above-mentioned literatures. Hereinafter, the structure and operation of an exemplary ferroelectric type NVDRAM, where a two transistor/cell method is used, will be described. The two transistor/cell method is known to be immune to possible variations in the fabrication process.

As shown in FIG. 2, this ferroelectric type NVDRAM includes a plurality of word lines WL and corresponding plate lines PL. The word lines WL are connected to a word line decoder 31. The plate lines PL are connected to a plate line decoder 32. The NVDRAM also includes a plurality of pairs of bit lines bit and $\overline{\text{bit}}$. Each pair of bit lines bit and $\overline{\text{bit}}$ are connected to a sense amplifier 33. In FIG. 2, only one pair of bit lines bit and $\overline{\text{bit}}$ and their corresponding sense amplifier 33 are shown.

A memory cell 34 is provided in each portion where one of the word lines WL and its corresponding plate line PL intersect a pair of bit lines bit and $\overline{\text{bit}}$. In FIG. 2, only one memory cell 34 is shown. The memory cell 34 includes two capacitor elements $C_1$ and $C_2$ and two selection transistors $Q_1$ and $Q_2$. One of the terminals of the capacitor element $C_1$ is connected to the bit line bit via the transistor $Q_1$. One of the terminals of the capacitor element $C_2$ is connected to the bit line $\overline{\text{bit}}$ via the transistor $Q_2$. The other terminals of the capacitor elements $C_1$ and $C_2$ are connected to the plate line PL. Gates of the transistors $Q_1$ and $Q_2$ are connected to the word line WL.

The above-described ferroelectric type NVDRAM operates in the following manner. The word line decoder 31 and the plate line decoder 32 select, respectively, one of the word lines WL and one of the plate lines PL, in accordance with an address signal input to an address buffer 35. Then, the memory cell 34 is accessed in a mode chosen in accordance with a control signal input to a control signal input buffer 36. Specifically, the access operation is conducted in one of the following modes: in a DRAM-mode for accessing data to be stored in a volatile manner, the NVDRAM is controlled by a DRAM-mode timing control circuit 37; in a recall-mode for reading and rewriting data stored in a non-volatile manner, the NVDRAM is controlled by a recall-mode timing control circuit 38; in a store-mode for writing data to be stored in a non-volatile manner, the NVDRAM is controlled by a store-mode timing control circuit 39. The inputting and the outputting of the data to be accessed are conducted through a data I/O interface 40.

Hereinafter, a writing operation of data in the store-mode, controlled by the store-mode timing control circuit 39, will be described with reference to FIGS. 3 and 4.

As shown in FIG. 3, when data "0" is to be written, for example, a voltage of 0 V and a voltage of 5 V (i.e. supply voltage Vcc) are applied to, respectively, the bit line bit and the bit line $\overline{\text{bit}}$, and a voltage pulse which varies from 0 V to 5 V and back to 0 V is applied to the plate line PL while keeping the word line WL in an active state. As a result, the polarization state of the ferroelectric material of the capacitor element $C_1$ shifts from point C or point E to point B, and then to point C as shown in FIG. 1. The polarization state of the ferroelectric material of the capacitor element $C_2$ shifts from point D to point E and back to point D as shown in FIG. 1. Accordingly, after these voltages are stopped being applied, the ferroelectric materials of the capacitor elements $C_1$ and $C_2$ have the remanent polarizations of points C and E, respectively, so that the data "0" is stored in a non-volatile manner.

When data "1" is to be written, as shown in FIG. 4, a voltage of 5 V (i.e. supply voltage Vcc) and a voltage of 0 V are applied to, respectively, the bit line bit and the bit line $\overline{\text{bit}}$, in contrast to the voltages of 0 V and 5 V applied in the above-mentioned case of writing the data "0". A voltage pulse which varies from 0 V to 5 V and back to 0 V is applied to the plate line PL while keeping the word line WL in an active state, whereby the ferroelectric materials of the capacitor elements $C_1$ and $C_2$ are made to have the remanent polarizations of points E and C, respectively, so that the data "1" is stored in a non-volatile manner.

Next, a recalling operation of data in the recall-mode, controlled by the recall-mode timing control circuit 38, will be described with reference to FIG. 5. In this operation, the pair of bit lines bit and $\overline{\text{bit}}$ are precharged at a voltage of 0 V and thereafter are placed in an open state. Then, a voltage which varies from 0 V to 5 V is applied to the plate line PL while keeping the word line WL in an active state. As a result, in the case where data "0" is stored, the polarization state of the ferroelectric material of the capacitor element $C_1$ shifts from point C to point B as shown in FIG. 1, while the polarization state of the ferroelectric material of the capacitor element $C_2$ shifts from point E to point B. Thus, the polarization state of the ferroelectric material of the capacitor element $C_2$ is inverted, so that the potential of the bit line $\overline{\text{bit}}$, which is connected to the capacitor element $C_2$, becomes higher than that of the bit line bit by several hundred mV (millivolts). Accordingly, by sensing the difference between the potentials of the bit lines bit and $\overline{\text{bit}}$ by the sense amplifier 33, the data stored in a non-volatile manner can be read out. However, the polarization states of the capacitor elements $C_1$ and $C_2$ both shift to point B, so that the data which has been stored in a non-volatile manner is lost, resulting in a destructive read-out of the data.

In the recall-mode, the data which has been recalled can be rewritten in the NVDRAM by storing the data in a non-volatile manner. This can be conducted by, after the pair of bit lines bit and $\overline{\text{bit}}$ are set at 0 V and 5 V by the sense amplifier 33, applying a voltage which varies from 0 V to 5 V and back to 0 V to the plate line PL in the same procedure as that for the store-mode. In addition, by maintaining the plate line PL at 0 V after the above procedure, the potentials set for the pair of bit lines bit and $\overline{\text{bit}}$ can be stored in the memory cell 34 as charges, thus realizing storage in a DRAM mode (to be described later).

The potential difference in the pair of bit lines bit and $\overline{\text{bit}}$ which is generated in the recall-mode is in proportion to the intensity of the remanent polarization and in inverse proportion to the bit line capacitance. Accordingly, a larger potential difference can be obtained as the remanent polarization increases and as the bit line capacity decreases, thereby facilitating the detection by the sense amplifier 33.

An accessing operation in the DRAM-mode, controlled by the DRAM-mode timing control circuit 37, is achieved by the same procedure as that for a conventional DRAM except that a voltage of 0 V or 5 V (i.e. supply voltage Vcc) is applied to the plate line PL. Thus, the polarization states of the ferroelectric materials of the capacitor element $C_1$ and $C_2$ shift only between point D and point E or between point B and point C, neither of which results in any inversion of polarization. Therefore, the reading and writing of the data stored in a volatile manner can be conducted by utilizing the charges stored in the capacitor element $C_1$ and $C_2$ alone, as in the case of a conventional DRAM. In addition, a refreshing operation can be conducted.

Although a ferroelectric type NVDRAM of a two transistor/cell type, which is relatively immune to influences of the fluctuation in the thickness of the ferroelectric material film, was described above, substantially the same principle applies to an NVDRAM having a memory cell array structure of one transistor/cell type having relatively small cell areas and thus being suitable for higher degrees of integration, such as that disclosed in Japanese Patent Application No. 4-324506.

It is possible to operate either of the DRAM/EEPROM type NVDRAM and the ferroelectric type NVDRAM described above exclusively in the store-mode for storing data in a non-volatile manner and in the recall-mode for recalling the stored data.

However, in the case of a DRAM/EEPROM type NVDRAM, the EEPROM does not permit rewriting that exceeds one hundred thousand times or more, so that the EEPROM will soon reach the end of its lifetime if frequent rewriting operations are conducted.

In the case of a ferroelectric type NVDRAM, the ferroelectric materials included in the capacitor elements $C_1$ and $C_2$ permits only a limited number of polarization inversions, so that the recalling/storing operations are limited to about $10^8$ to $10^{12}$ times. Therefore, the lifetime of the memory cells 34 can expire in a few days by conducting successive accessing at a cycle period of about 10 MHz. Therefore, studies are conducted on materials which leave a large remanent polarization and permit a large number of polarization inversions.

In view of the above problems, in the case of a DRAM/EEPROM type NVDRAM, the EEPROM is prevented from undergoing an excessively large number of rewriting operations by ensuring that only the DRAM is accessed during usual operations, so that the data stored in the DRAM is saved in the EEPROM only immediately before the NVDRAM is turned off, and that the data is recalled into the DRAM in a recall-mode when the NVDRAM is turned on the next time. In the case of a ferroelectric type NVDRAM, the number of the accessing operations that result in polarization inversions is minimized by ensuring that accessing operations in the DRAM-mode, which do not result in any inversion of polarization, are conducted during usual operations and that the data in the memory cells 34 is stored in a non-volatile manner only before the NVDRAM is turned off, the stored data only being recalled in the recall-mode in the first reading operation when the NVDRAM is turned on the next time.

A conventional NVDRAM performs the above-mentioned recalling operations and refreshing operations in accordance with a combination of a plurality of external input signals. Specifically, a recalling operation is conducted by activating, or setting at the low level, a non-volatile storage enable signal $\overline{NE}$, a chip enable signal $\overline{CE}$, and an output enable signal $\overline{OE}$, and by inactivating, or setting at the high level, a write enable signal $\overline{WE}$ and a refresh signal $\overline{RFSH}$. A refreshing operation for the volatile storage is conducted by activating the chip enable signal $\overline{CE}$ alone and by supplying an address signal from the outside.

The refreshing operation for the volatile storage can be automatically conducted, without frequently varying the external input signals, by activating the refresh signal $\overline{RFSH}$ alone so that a self-refreshing is achieved with the use of an internal counter, as in the case of a pseudo SRAM (Static RAM). It is also applicable to so configurate the NVDRAM that the output enable signal $\overline{OE}$ also functions as the refresh signal $\overline{RFSH}$ in order to reduce the number of pins on the NVDRAM. However, even in the case of conducting such self-refreshing, it is necessary to previously recall the data stored in a non-volatile manner, in a recalling operation, so as to conduct a volatile storage for the recalled data.

Therefore, a conventional NVDRAM requires a recalling operation before an accessing operation in the DRAM-mode, thereby necessitating controlling of a combination of the external input signals. This results in the problem that a more complex control is required than in the case of other memory devices such as pseudo SRAMs. This problem is also common to the case where the NVDRAM is constructed by using SRAMs, which do not require refreshing operations.

Moreover, during a refreshing operation in the DRAM-mode, a relatively large current of about 200 µA is required. This has led to the strong demand for the reduction in the power consumption of NVDRAMs, whose applications as in IC cards and memory devices in portable electric equipments are attracting much attention. However, there is a limit to the reduction in the power consumption of NVDRAMs during the refreshing operations by elaborating the internal circuitry thereof or by improving the fabrication process for the semiconductor material used therein. The power consumption can also be reduced by applying strict limitations in terms of margin values to the specification of the data retaining current, that is, by reducing the margin areas. However, this results in another problem in that the yield of the NVDRAMs may decrease.

The above-mentioned problems are common to both the case where the NVDRAM is realized as a separate memory device and the case where the memory cell is realized as a memory module for a single chip microcomputer.

SUMMARY OF THE INVENTION

An NVDRAM according to the present invention includes: volatile memory cells which require a refreshing operation for retaining content stored therein; non-volatile memory cells which permit content stored therein to be rewritten; address generation means for automatically generating in sequence respective addresses of the memory cells in accordance with a clock signal; self-refresh means for performing a refreshing operation by sequentially rewriting the content stored in each volatile memory cell based on the addresses generated by the address generation means; refresh timing means for measuring a duration for which the self-refresh means continually performs a refreshing operation; self-store starting means for determining whether or not the duration of the refreshing operation as measured by the refresh timing means has exceeded a predetermined time amount; and self-store means for, when the self-store starting means determines that the duration of the refreshing operation as measured by the refresh timing means has exceeded the predetermined time amount, stopping the refreshing operation by the self-refresh means and for sequentially transferring the content stored in the volatile memory cells to the non-volatile memory cells to be stored therein based on the addresses generated by the address generation means.

In one embodiment of the invention, the NVDRAM further includes: clock signal supplying means for supplying two clock signals to be used for automatically generating the addresses, the clock signals having different periods from each other; and clock signal switching means for ensuring that the clock signal supplying means supplies a clock signal having a longer period when the self-refresh means performs a refreshing operation and that the clock signal supplying means supplies a clock signal having a shorter period when the self-store means performs a storing operation.

In another embodiment of the invention, the NVDRAM further includes recall requiring signal generation means for generating a recall requiring signal for requiring a recalling operation, when the self-store means has performed a storing operation, so as to recall the content stored in the non-volatile memory cells.

Alternatively, an NVDRAM according to the present invention includes: memory cells having a volatile storage function which requires a refreshing operation for retaining content stored in the memory cells and a non-volatile storage function which permits content stored in the memory cells to be rewritten; address generation means for automatically generating in sequence respective addresses of the memory cells in accordance with a clock signal; self-refresh means for performing a refreshing operation by sequentially rewriting the content that is stored in each memory cell in a volatile manner based on the addresses generated by the address generation means; refresh timing means for measuring a duration for which the self-refresh means continually performs a refreshing operation; self-store starting means for determining whether or not the duration of the refreshing operation as measured by the refresh timing means has exceeded a predetermined time amount; and self-store means for, when the self-store starting means determines that the duration of the refreshing operation as measured by the refresh timing means has exceeded the predetermined time amount, stopping the refreshing operation by the self-refresh means and for sequentially re-storing the content that is stored in the memory cells in a volatile manner in the same memory cells in a non-volatile manner based on the addresses generated by the address generation means.

In one embodiment of the invention, the NVDRAM further includes: clock signal supplying means for supplying two clock signals to be used for automatically generating the addresses, the clock signals having different periods from each other; and clock signal switching means for ensuring that the clock signal supplying means supplies a clock signal having a longer period when the self-refresh means performs a refreshing operation and that the clock signal supplying means supplies a clock signal having a shorter period when the self-store means performs a storing operation.

In another embodiment of the invention, the NVDRAM further includes recall requiring signal generation means for generating a recall requiring signal for requiring a recalling operation., when the self-store means has performed a storing operation, so as to recall the content stored in the non-volatile memory cells.

Alternatively, an NVDRAM according to the present invention includes: volatile memory cells which require a refreshing operation for retaining content stored therein; non-volatile memory cells which permit content stored therein to be rewritten; address generation means for automatically generating in sequence respective addresses of the memory cells in accordance with a clock signal; self-store means for performing a refreshing operation by sequentially rewriting the content stored in each volatile memory cell and for transferring the content stored in the volatile memory cells to the non-volatile memory cells to be stored therein based on the addresses generated by the address generation means; self-store timing means for measuring a duration for which the self-store means continually performs a storing operation; means for determining whether or not the duration of the storing operation as measured by the self-store timing means has exceeded a predetermined time amount; and means for, when the duration of the refreshing operation as measured by the self-store timing means is determined to have exceeded the predetermined time amount, stopping the refreshing operation and the storing operation by the self-store means.

In one embodiment of the invention, the NVDRAM further includes recall requiring signal generation means for generating a recall requiring signal for requiring a recalling operation, when the self-store means has performed a storing operation, so as to recall the content stored in the non-volatile memory cells.

In another embodiment of the invention, the NVDRAM includes: memory cells having a volatile storage function which requires a refreshing operation for retaining content stored in the memory cells and a non-volatile storage function which permits content stored in the memory cells to be rewritten; address generation means for automatically generating in sequence respective addresses of the memory cells in accordance with a clock signal; self-store means for performing a refreshing operation by sequentially rewriting the content that is stored in each memory cell in a volatile manner and for sequentially re-storing the content that is stored in a volatile manner in a non-volatile manner based on the addresses generated by the address generation means; self-store timing means for measuring a duration for which the self-store means continually performs a storing operation; means for determining whether or not the duration of the storing operation as measured by the self-store timing means has exceeded a predetermined time amount; and means for, when the duration of the refreshing operation as measured by the self-store timing means is determined to have exceeded the predetermined time amount, stopping the refreshing operation and the storing operation by the self-store means.

In still another embodiment of the invention, the NVDRAM further includes recall requiring signal generation means for generating a recall requiring signal for requiring a recalling operation, when the self-store means has performed a storing operation, so as to recall the content stored in the non-volatile memory cells.

Alternatively, an NVDRAM according to the present invention includes: memory cells having a volatile storage function which requires a refreshing operation for retaining content stored in the memory cells and a non-volatile storage function which permits content stored in the memory cells to be rewritten; refresh signal input means for receiving a refresh signal; recall requiring signal generation means for generating a recall requiring signal; address generation means for automatically generating in sequence respective addresses of the memory cells in accordance with a clock signal; recall means for, when a refresh signal is input to the refresh signal input means and the recall requiring signal generation means is generating a recall requiring signal, sequentially re-storing the content that is stored in the memory cells in a volatile manner in the same memory cells in a non-volatile manner based on the addresses generated by the address generation means; recalling operation control means for terminating the generation of the recall requiring signal by the recall requiring signal generation means when the recall means has performed a predetermined number of recalling operations for the memory cells; and refresh means for performing a refreshing operation by, when a refresh signal is input to the refresh signal input means and the recall requiring signal generation means is not generating a recall requiring signal, sequentially rewriting the content that is stored in each memory cell in a volatile manner based on the addresses generated by the address generation means.

In one embodiment of the invention, each of the memory cells comprises a capacitor element in which a ferroelectric material is interposed.

In another embodiment of the invention, the NVDRAM further includes refresh signal generation means for generating the refresh signal from a point of time when a $\overline{RAS}$ signal becomes active after a $\overline{CAS}$ signal becomes active, until a point of time when the $\overline{RAS}$ signal becomes inactive after the $\overline{CAS}$ signal becomes inactive.

In still another embodiment of the invention, the NVDRAM further includes: clock signal supplying means for supplying two clock signals to be used for the automatic generation of the addresses, the clock signals having different periods from each other; and clock signal switching means for ensuring that the clock signal supplying means supplies a clock signal having a shorter period when the recall means performs a recalling operation and that the clock signal supplying means supplies a clock signal having a longer period when the refresh means performs a refreshing operation.

In still another embodiment of the invention, the refresh means performs a refreshing operation by sequentially rewriting the content that is stored in each memory cell in a volatile manner based on the addresses generated by the address generation means, and performs a storing operation so as to re-store the content that is stored in a volatile manner in the same memory cell in a non-volatile manner concurrently with the refreshing operation for the memory cells.

Alternatively, an NVDRAM according to the present invention includes: memory cells includes volatile memory cells which require a refreshing operation for retaining content stored therein; non-volatile memory cells which permit content stored therein to be rewritten; refresh signal input means for receiving a refresh signal; recall requiring signal generation means for generating a recall requiring signal; address generation means for automatically generating in sequence respective addresses of the memory cells in accordance with a clock signal; recall means for, when a refresh signal is input to the refresh signal input means and the recall requiring signal generation means is generating a recall requiring signal, sequentially recalling the content stored in the non-volatile memory cells into the volatile memory cells based on the addresses generated by the address generation means; recalling operation control means for terminating the generation of the recall requiring signal by the recall requiring signal generation means when the recall means has performed a predetermined number of recalling operations for the memory cells; and refresh means for performing a refreshing operation by, when a refresh signal is input to the refresh signal input means and the recall requiring signal generation means is not generating a recall requiring signal, sequentially rewriting the content stored in the volatile memory cells based on the addresses generated by the address generation means.

In one embodiment of the invention, the volatile memory cells are composed essentially of DRAMs and the non-volatile memory cells are composed essentially of EEPROMs.

In another embodiment of the invention, the NVDRAM further includes refresh signal generation means for generating the refresh signal from a point of time when a $\overline{RAS}$ signal becomes active after a $\overline{CAS}$ signal becomes active, until a point of time when the $\overline{RAS}$ signal becomes inactive after the $\overline{CAS}$ signal becomes inactive.

In still another embodiment of the invention, the NVDRAM further includes: clock signal supplying means for supplying two clock signals to be used for automatically generating the addresses, the clock signals having different periods from each other; and clock signal switching means for ensuring that the clock signal supplying means supplies a clock signal having a shorter period when the recall means performs a recalling operation and that the clock signal supplying means supplies a clock signal having a longer period when the refresh means performs a refreshing operation.

In still another embodiment of the invention, the refresh means performs a refreshing operation by sequentially rewriting the content that is stored in each memory cell in a volatile manner based on the addresses generated by the address generation means, and performs a storing operation so as to re-store the content that is stored in a volatile manner in the same memory cell in a non-volatile manner concurrently with the refreshing operation for the memory cells.

Thus, the invention described herein makes possible the advantages of (1) providing an NVDRAM such that, when refreshing operations based on a self refreshing function thereof have continued for a predetermined amount of time or more, data is automatically saved in non-volatile memory cells or stored in a non-volatile manner so that an increase in power consumption due to refreshing operations is prevented, the NVDRAM being applicable to a $\overline{RAS}$-$\overline{CAS}$ type DRAM capable of self-refreshing; and (2) providing an NVDRAM such that a recalling operation is automatically conducted simply by instructing a self-refreshing of volatile storage, so that the control of the NVDRAM is facilitated.

These and other advantages of the present invention will become apparent to those skilled in the art upon reading and understanding the following detailed description with reference to the accompanying figures.

DESCRIPTION OF THE PREFERRED EMBODIMENTS

Figure 1:
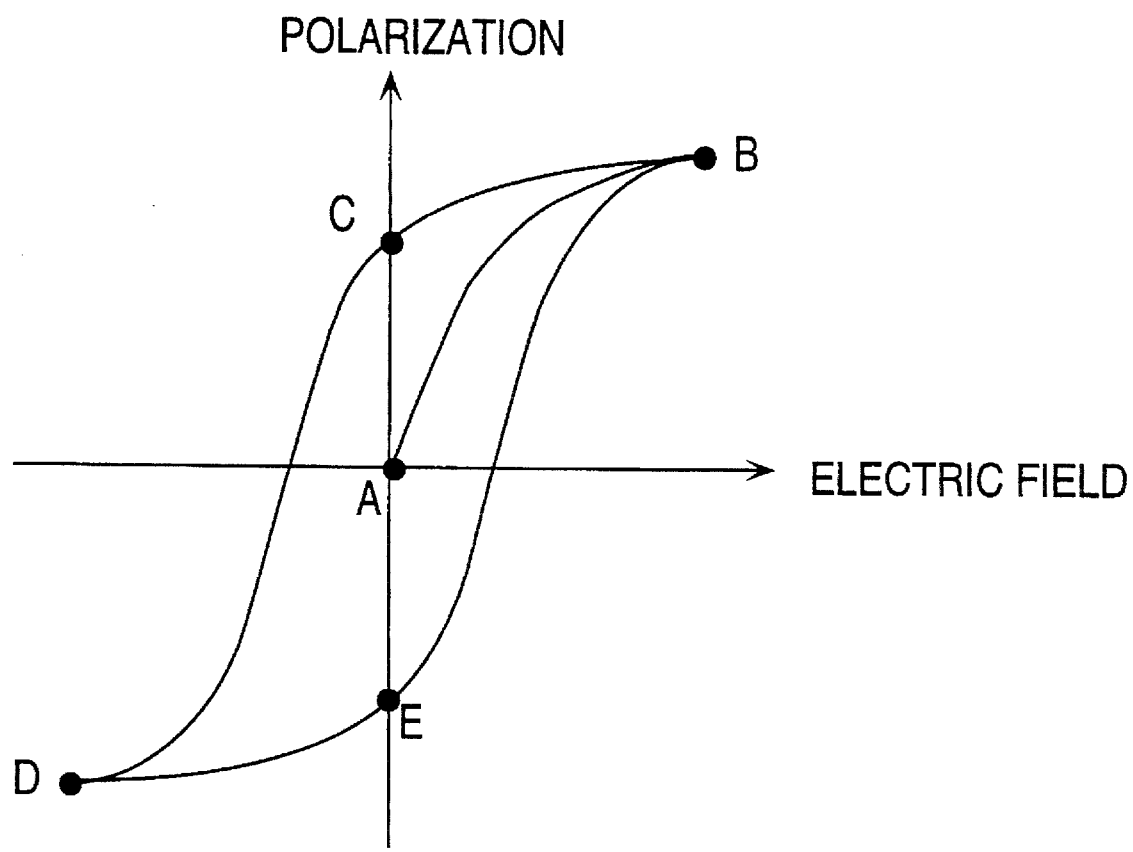
FIG. 1 is a diagram showing the hysteresis characteristics of a ferroelectric material.

First, the outline of the present invention will be described.

The present invention is applicable to DRAM/EEPROM type NVDRAMs, i.e. NVDRAMs in which a DRAM and an EEPROM are used in combination. This type of NVDRAM includes both volatile memory cells and non-volatile memory cells. The present invention is also applicable to a ferroelectric type NVDRAM. This type of NVDRAM includes memory cells capable of both volatile storage and non-volatile storage.

An address generation circuit automatically generates in sequence the respective addresses of the memory cells in accordance with a clock signal which is externally fed or internally generated. A self-refresh circuit and a self-store circuit perform refreshing operations and storing operations on the basis of these addresses.

In the case of a conventional pseudo SRAM, a refreshing operation which is performed in synchronization with an external control signal and a refreshing operation which is not performed in synchronization with an external control signal are referred to as an auto-refreshing and a self-refreshing, respectively. The present example adopts similar terminologies so that a recalling operation/storing operation which is performed in synchronization with an external control signal is referred to as an auto-recalling operation/auto-storing operation, and that a recalling operation/storing operation which is not performed in synchronization with an external control signal is referred to as a self-recalling operation/self-storing operation. However, a "self-refreshing operation"/"self-recalling operation"/"self-storing operation" as used hereinafter includes both auto-refreshing/auto-recalling/auto-storing and self-refreshing/self-recalling/self-storing.

The self-refresh circuit as used herein automatically performs refreshing operations in a DRAM-mode of the NVDRAM, so as to maintain any content stored in a volatile manner. The self-refresh circuit usually performs a refreshing operation when a control signal input from the outside (or another module within the microcomputer chip) satisfies predetermined conditions. A refresh timing circuit measures an amount of time for which the self-refresh circuit continuously conducts refreshing operations. The refreshing operations, as performed by the self-refresh circuit, can be conducted by any method so long as the addresses are automatically generated inside the chip; for example, the refreshing operations may be conducted when no accessing is taking place, or accessing can be inhibited while a refreshing operation is conducted for all the rows. However, irrespective of the manner in which refreshing operations are conducted, it is assumed that refreshing operations are stopped and do not continue once an access is made in accordance with a reading or a writing. As for the continuity of refreshing operations, it is applicable to judge the states of all the memory cells of the NVDRAM at the same time as well as judge the state of each of a plurality of blocks of memory cells. The refresh timing circuit may measure the duration of refreshing operations by: actually measuring the time independently; counting the clock signal; or counting the number of times an address generated by the address generation circuit changes.

A self-store starting circuit determines whether or not the duration of the refreshing operations has exceeded a predetermined value. If the duration of the refreshing operations has exceeded the predetermined value (i.e., if the refreshing operations have been conducted for the predetermined amount of time or longer), it indicates that no access was made to the NVDRAM or a pertinent block in the NVDRAM during the predetermined amount of time, suggesting that it is likely that no access will be made for a while (after the predetermined amount of time has passed). Therefore, if the self-store starting circuit judges that the refreshing operations have continued longer than the predetermined amount of time, the self-store circuit stops the refresh operations by the self-refresh circuit, and performs a storing operation for each memory cell on the basis of the addresses generated by the address generation circuit. As a result, the content stored in the volatile memory cells is sequentially transferred so as to be stored in the non-volatile memory cells, or the content stored in a given memory cell in a volatile manner is re-stored in the same memory cell in a non-volatile manner, so that the stored content can be retained without performing refreshing operations.

Thus, in accordance with the NVDRAM of the present invention, any content which has been stored in a volatile memory cell or stored in a volatile manner and has not been accessed for a predetermined amount of time or longer is automatically transmitted to a non-volatile memory cell or re-stored in the same memory cell in a non-volatile manner by the self-store circuit. As a result, there is no need for the self-refresh circuit to perform refresh operations. In other words, refresh operations, which consumes a large amount of power, is prevented from continuing for a long period of time by switching any stored content which is not likely to be immediately accessed to non-volatile storage. Although the number of writing operations to be conducted for the EEPROMs or the ferroelectric material increases owing to the storing operation of the self-store circuit, it is possible to guarantee that, assuming that the NVDRAM is capable of being rewritten $10^8$ times or more, the NVDRAM will have an operational life of about 10 years, even if the predetermined amount of time to be set in the self-store starting circuit is set at 1 second.

Since the power consumption of the NVDRAM decreases as the period between refresh operations by the self-refresh circuit increases, it is desirable to conduct refresh operations by the self-refresh circuit with the longest possible period that falls within the predetermined range of refresh periods. However, storing operations should be completed as quickly as possible because external accessing cannot be conducted while a storing operation is conducted by the self-store circuit. Therefore, according to the present invention, a clock signal switching circuit switches between two clock signals that are supplied from a clock signal supplying circuit so that the clock signal having the longer period is supplied to the address generation circuit when the self-refresh circuit performs a refreshing operation and that the clock signal having the shorter period is supplied to the address generation circuit when the self-store circuit performs a storing operation. The above-mentioned requirements regarding the refreshing operations and the storing operations can be satisfied by thus varying the generation velocity of addresses.

Once the self-store circuit performs and completes a storing operation, the NVDRAM is placed into a stand-by state, that is, no refreshing operation for retaining volatile data is performed in the NVDRAM. As a result, the content stored in a volatile manner in the DRAM-mode is destroyed, so that no reading in the DRAM-mode can be conducted thereafter, although writing in the DRAM-mode is possible. Accordingly, it is necessary to conduct reading for the non-volatile storage in the recall-mode. By so ensuring that a recall requiring signal generation circuit generates a recall requiring signal when the self-store circuit has performed a storing operation, it becomes possible to facilitate the control of accessing operations from external equipments and other internal modules. It is also possible to protect the stored content by adopting such a configuration that any operation other than recalling operations is inhibited.

Moreover, according to another aspect of the present invention, a refresh signal input circuit inputs a refresh signal via an external terminal of an LSI (Large Scale Integrated circuit), a pad provided on the chip, or another circuit on the same chip. One objective of the present invention is to control the recalling operations and refreshing operations of the NVDRAM by only controlling the refresh signal.

The recall requiring signal generation circuit generates a recall requiring signal when the stored content is not retained by refreshing operations, e.g. when the NVDRAM has just been turned on or when a storing operation has been completed. The generation of the recall requiring signal is terminated by a recalling operation control circuit (to be described later) when the recalling operation has finished. The address generation circuit automatically generates in sequence the respective addresses of the memory cells in accordance with a clock signal which is externally fed or internally generated. The recall circuit and the refresh circuit perform recalling operations and refreshing operations for the memory cells on the basis of these addresses.

When the NVDRAM has just been turned on or when a storing operation has been completed, a recall requiring signal is generated. As a result, when a refresh signal is first input after the generation of the recall requiring signal, the recall circuit performs a recalling operation so as to recall the content stored in a non-volatile manner and re-stores it in a volatile manner. When the recalling operation has finished, as described above, the recalling operation control circuit terminates the generation of the recall requiring signal. Thereafter, the refresh circuit performs refreshing operations so as to retain the content stored in a volatile-manner. In the case where the inputting of the refresh signal is once terminated (in accordance with an accessing to the NVDRAM, etc.) and then restarted, the generation of the recall requiring signal has been suspended, so that refreshing operations are continued by the refreshing circuit.

Accordingly, any device or circuit which accesses the NVDRAM can simply control the refresh signal to conduct refreshing operation for the content stored in a volatile manner (after automatically performing a recalling operation in the case where the content stored in a non-volatile manner has not been recalled in a volatile-manner. As a result, it is possible to operate the NVDRAM, in which complicated control is actually made, as if operating a pseudo SRAM, for example, which is much simpler to operate.

Thus, the NVDRAM according to the present invention realizes easy operations as if it is a pseudo SRAM by controlling the refresh signal. If a refresh signal generation circuit for generating the refresh signal is further incorporated in the NVDRAM, the NVDRAM can be operated as if it is a $\overline{CAS}$ (Column Address Strobe)-before-$\overline{RAS}$ (Row Address Strobe) refresh type DRAM.

Recalling operations should be completed as quickly as possible. At the same time, it is desirable to conduct refresh operations by the self-refresh circuit with the longest possible period that falls within the predetermined range of refresh periods because the power consumption of the NVDRAM decreases as the period between refresh operations by the self-refresh circuit increases. Therefore, according to the present invention, a clock signal switching circuit switches between two clock signals that are supplied from a clock signal supplying circuit so that the clock signal having the shorter period is supplied to the address generation circuit when the recall circuit performs a recalling operation and that the clock signal having the longer period is supplied to the address generation circuit when the refresh circuit performs a refreshing operation. The above-mentioned requirements regarding the recalling operations and the refreshing operations can be satisfied by thus varying the generation velocity of addresses.

It is also applicable to adopt a configuration such that the refresh circuit refreshes the content stored in a non-volatile manner through a storing operation, as well as perform a refreshing operation for the content stored in a volatile manner.

In cases where a recalling operation by the recall circuit conducts a destructive reading of the content stored in a non-volatile manner, the stored content that has been recalled can be re-stored in a non-volatile manner.

Hereinafter, the present invention will be described by way of examples, with reference to the accompanying drawings.

EXAMPLE 1

Example 1 relates to a ferroelectric type NVDRAM. In applications, this NVDRAM may be realized as a separate memory device or as a memory module for a single chip microcomputer.

Figure 2:
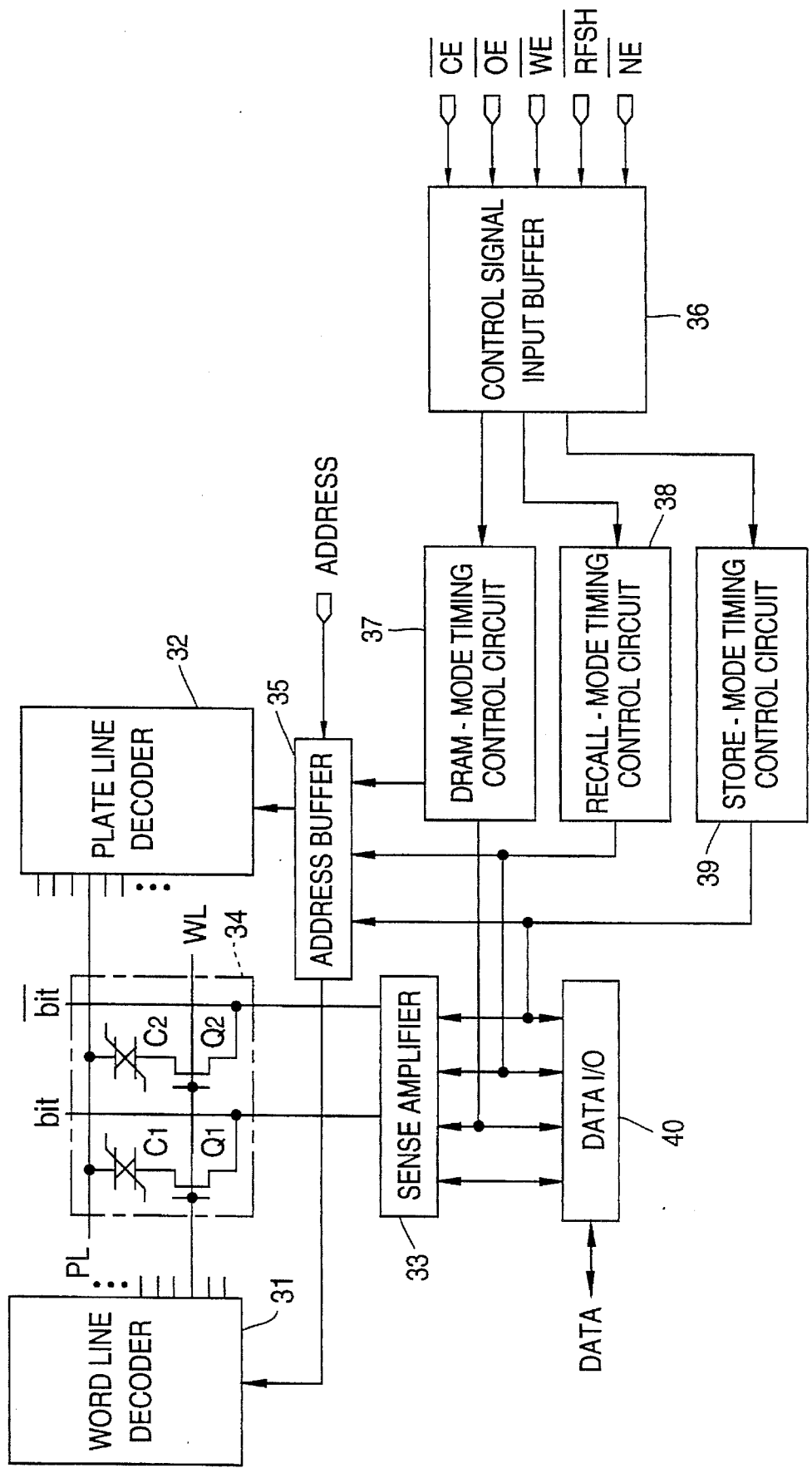
FIG. 2 is a block diagram showing a configuration for a conventional NVDRAM in which a ferroelectric material is used.
Figure 3:
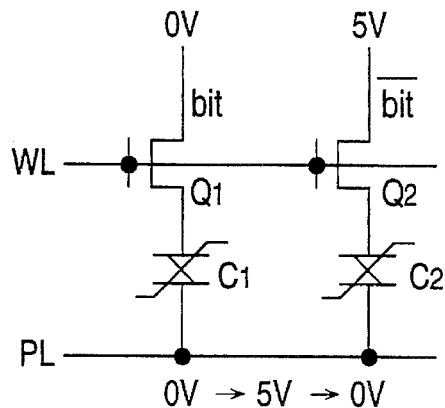
FIG. 3 is a diagram for describing an operation in a case where data "0" is written in a memory cell composed of a ferroelectric material in a store-mode.
Figure 4:
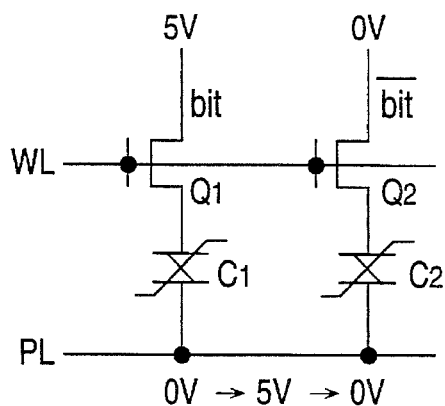
FIG. 4 is a diagram for describing an operation in a case where data "1" is written in a memory cell composed of a ferroelectric material in a store-mode.
Figure 5:
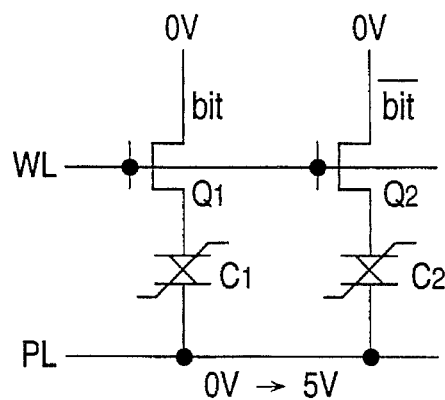
FIG. 5 is a diagram for describing an operation in a case where data is recalled from a memory cell composed of a ferroelectric material in a recall-mode.
Figure 6:
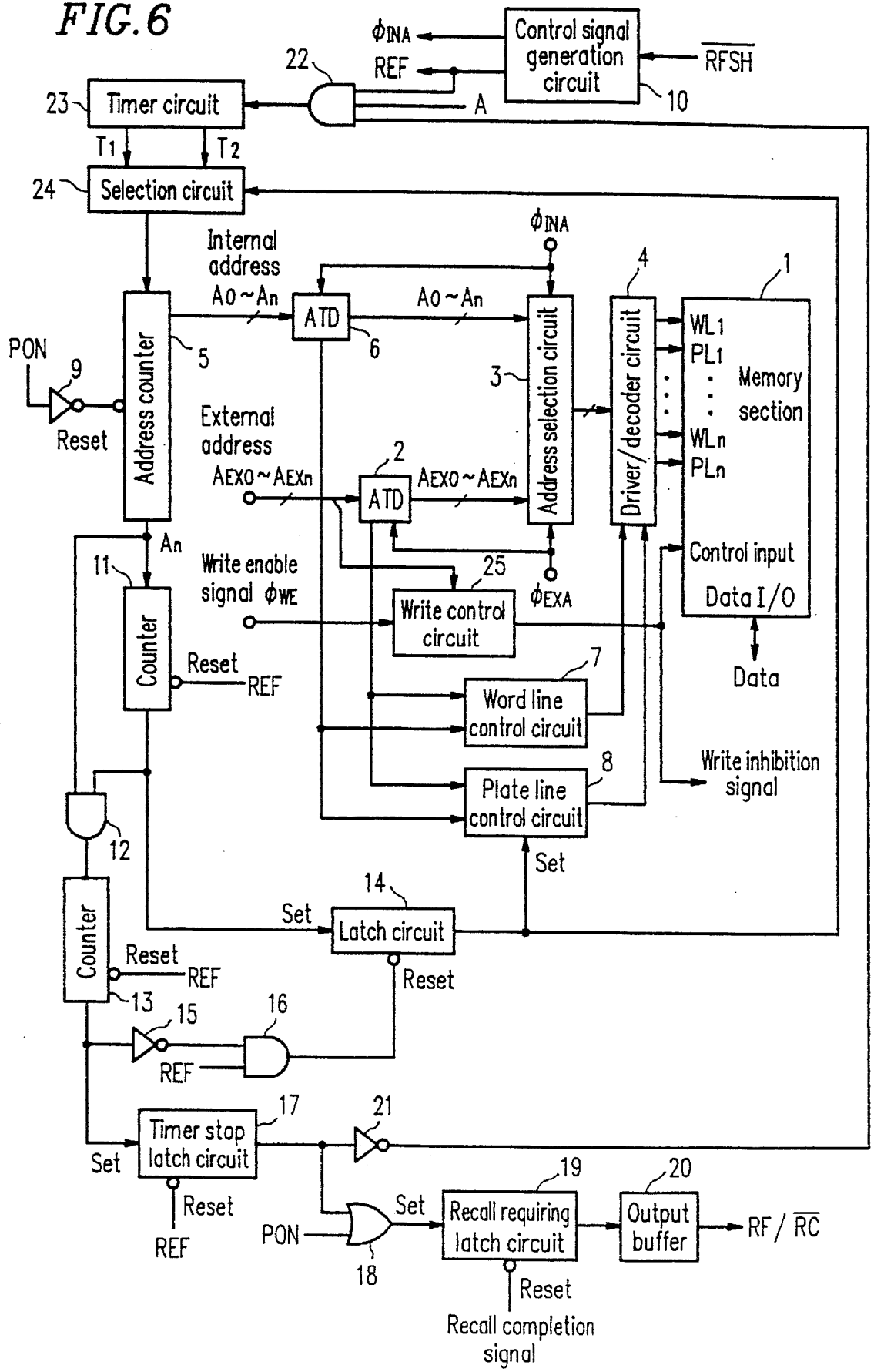
FIG. 6 is a block diagram showing a configuration for a control section of an NVDRAM according to Example 1 of the present invention.

FIG. 6 shows the NVDRAM according to Example 1, which includes a memory section 1. The memory section 1 includes a memory cell array, a sense amplifier, a data I/O interface, and the like. The memory cell array may, for example, consist of a plurality of memory cells 34 as shown in FIG. 2, the memory cells being of a two transistor/cell type. The memory cells may alternatively be of a one transistor/cell type.

As one variant of Example 1, the memory section 1 may alternatively be a memory in which a DRAM and an EEPROM are used in combination.

Figure 7:
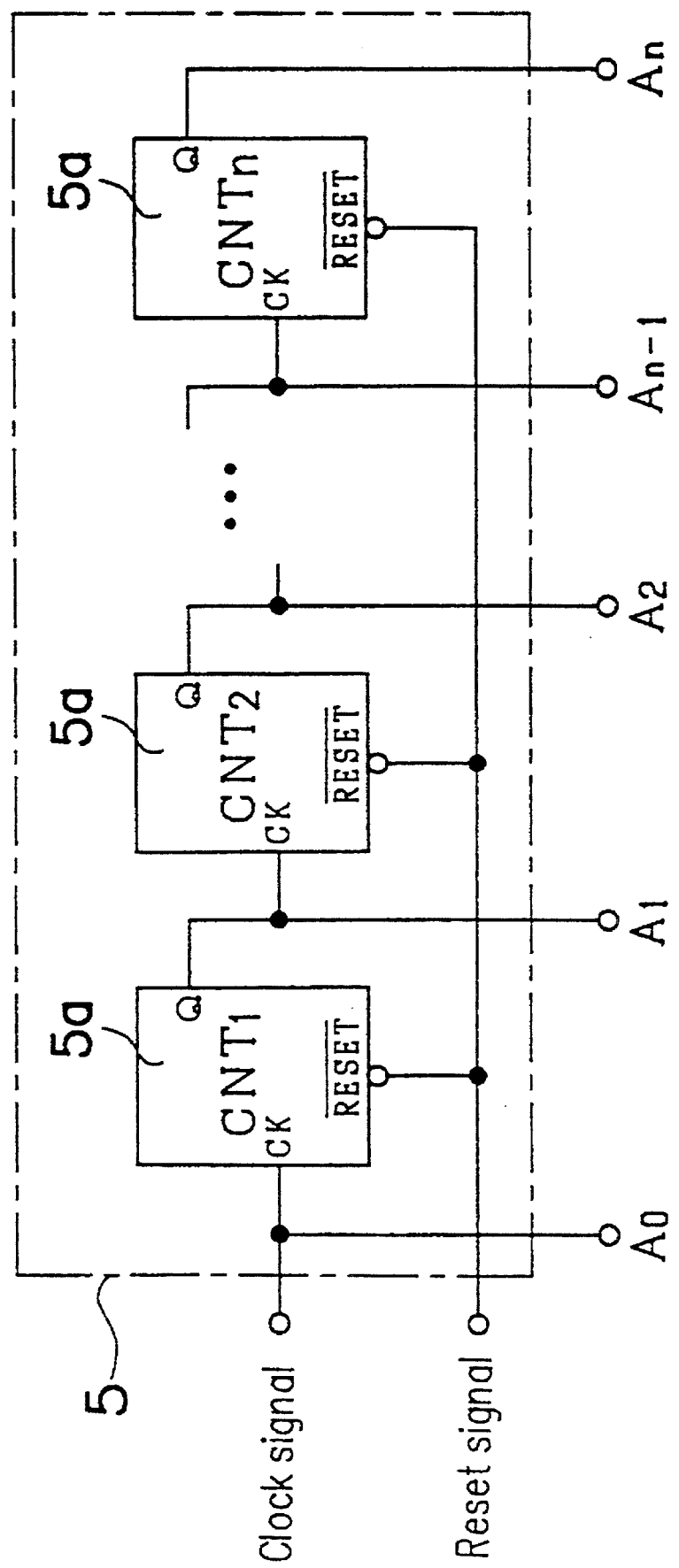
FIG. 7 is a block diagram showing a configuration for an address counter according to Example 1 of the present invention.

An external address $A_{EX0}$ to $A_{EXn}$, input from the outside, is sent to a driver/decoder circuit 4 via an external address transition detection circuit 2 and an address selection circuit 3. The NVDRAM also includes an address counter 5. As shown in FIG. 7, the address counter 5 is composed essentially of a number n of D type flip-flops 5a. A clock signal, input from the outside, is supplied to a clock input of the first D-type flip-flop 5a. An output Q of one D-type flip-flop 5a is coupled to a clock input of the next D-type flip-flop 5a. A reset signal, input from the outside, is supplied to a reset terminal $\overline{RESET}$ of each D-type flip-flop 5a. An inverse output $\overline{Q}$ of each D-type flip-flop 5a is coupled to a data input D of the same D-type flip-flop 5a, although not shown.

The address counter 5 operates in the following manner. When a clock signal is input from the outside, a signal (i.e. an internal address bit $A_1$) obtained by dividing the clock signal by two is provided from the output of Q of the first D-type flip-flop 5a; a signal (i.e. an internal address bit $A_2$) obtained by dividing the signal provided from the output Q of the first D-type flip-flop 5a is provided from the output Q of the next D-type flip-flop 5a; and so on. Thus, along with the clock signal (i.e. an internal address bit $A_0$), internal address bits $A_0$ to $A_n$ are obtained, the address bits $A_0$ to $A_n$ having successively increasing values. As shown in FIG. 6, an initialization pulse signal PON is input to, as a reset signal, the address counter 5 via an inverter circuit 9. The initialization pulse signal PON is set at the high level when the NVDRAM is turned on. As a result of supplying the initialization pulse signal PON, the internal address bits $A_0$ to $A_n$ are reset at their initial values (where all bits are at the low level). The internal address bits $A_0$ to $A_n$, output from the address counter 5, are input to the address selection circuit 3 via an internal address transition detection circuit 6.

The external address transition detection circuit 2 sends an external address $A_{EX0}$ to $A_{EXn}$ to the address selection circuit 3 when an external address activation signal $\Phi_{EXA}$ is active. The external address transition detection circuit 2 also detects, when the external address activation signal $\Phi_{EXA}$ is active, any change in the external address $A_{EX0}$ to $A_{EXn}$, and sends an address transition signal, which indicates the change in the external address $A_{EX0}$ to $A_{EXn}$, to a word line control circuit 7 and a plate line control circuit 8. The internal address transition detection circuit 6 sends internal address $A_0$ to $A_n$ to the address selection circuit 3 when an internal address activation signal $\Phi_{INA}$ is active. The internal address transition detection circuit 6 also detects any change in the internal address $A_0$ to $A_n$, and sends an address transition signal, which indicates the change in the internal address $A_0$ to $A_n$, to the word line control circuit 7 and the plate line control circuit 8. On receiving an address transition signal from the external address transition detection circuit 2 or the internal address transition detection circuit 6, the word line control circuit 7 controls the driver/decoder circuit 4 so as to drive a word line WL of the memory section 1. On receiving the address transition signal during a storing operation, the plate line control circuit 8 controls the driver/decoder circuit 4 so as to drive a plate line PL of the memory section 1.

Figure 8:
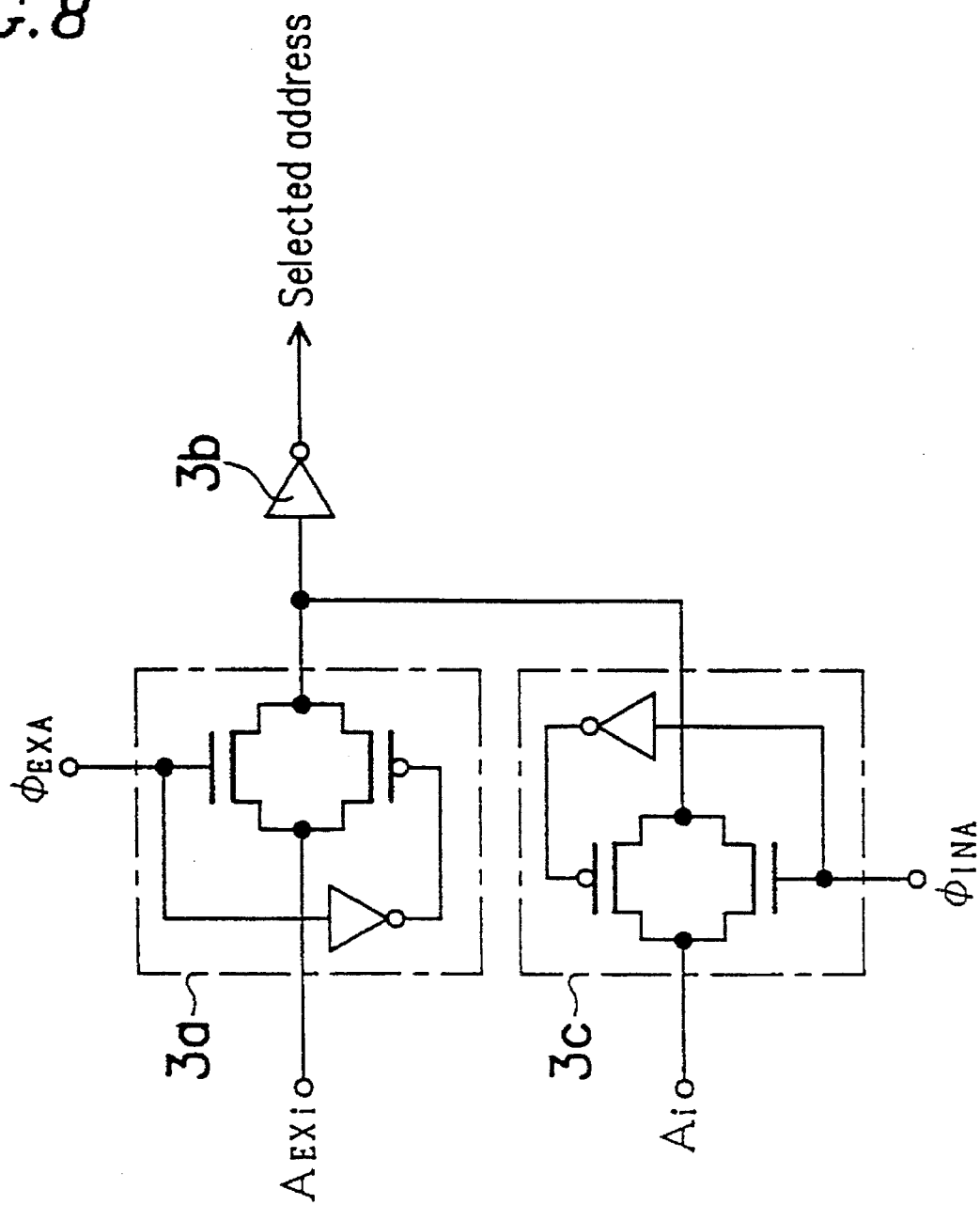
FIG. 8 is a block diagram showing a configuration for an address selection circuit according to Example 1 of the present invention.

FIG. 8 shows a configuration for an input/output circuit, corresponding to one bit of an address, in the address selection circuit 3. One bit of external address $A_{EXi}$ is input to a buffer circuit 3b via an external address selection circuit 3a. One bit of internal address $A_i$ is input to the buffer circuit 3b via an internal address selection circuit 3c. The external address selection circuit 3a includes a P-channel FET and an N-channel FET, both of which are placed in an ON state when the external address activation signal $\Phi_{EXA}$ is active (i.e., the high level), so that the external address $A_{EXi}$ is sent to the buffer circuit 3b. The internal address selection circuit 3c includes a P-channel FET and an N-channel FET, both of which are placed in an ON state when the internal address activation signal $\Phi_{INA}$ is active, so that the internal address $A_i$ is sent to the buffer circuit 3b. Thus, the address selection circuit 3 sends either the external address $A_{EX0}$ to $A_{EXn}$ or the internal address $A_0$ to $A_n$ to the driver/decoder circuit 4 as a selected address when the external address activation signal $\Phi_{EXA}$ or the internal address activation address $\Phi_{INA}$ is active.

The driver/decoder circuit 4 shown in FIG. 6 decodes an address sent from the address selection circuit 3, and drives a corresponding one of the word lines WL and a corresponding one of the plate lines PL in the memory section 1 in accordance with the control made by the word line control circuit 7 and the plate line control circuit 8.

The internal address activation signal $\Phi_{INA}$ is a signal generated by a control signal generation circuit 10, to which a refresh signal $\overline{RFSH}$ is input from the outside. The internal address activation signal $\Phi_{INA}$ is made active (i.e., the high level) when the refresh signal $\overline{RFSH}$ is active (i.e., the low level). The control signal generation circuit 10 also generates an internal refresh signal REF obtained by inverting the refresh signal $\overline{RFSH}$. In the case where the NVDRAM is realized as a separate memory device, the refresh signal $\overline{RFSH}$ may be supplied through an external terminal. In the case where the NVDRAM is realized as a memory module for a single chip microcomputer, the refresh signal $\overline{RFSH}$ may be supplied by means of a pad provided on the chip. The external address activation signal $\Phi_{EXA}$ becomes active when an accessing operation is made from the outside, and is generated by a control circuit (not shown).

In accordance with the above-described configuration, when the external address activation signal $\Phi_{EXA}$ is active, the external address $A_{EX0}$ to $A_{EXn}$ is sent to the driver/decoder circuit 4 via the external address transition detection circuit 2 and the address selection circuit 3. As a result, one of the memory cells in the memory section 1 that corresponds to the external address $A_{EX0}$ to $A_{EXn}$ is accessed. In accordance with an address transition signal generated by the external address transition detection circuit 2, the word line control circuit 7 and the plate line control circuit 8 drive a word line WL and a plate line PL of the memory section 1 in a mode corresponding to a control signal (not shown). When the internal address activation signal $\Phi_{INA}$ is active, the internal address $A_0$ to $A_n$ is sent to the driver/decoder circuit 4 via the internal address transition detection circuit 6 and the address selection circuit 3. As a result, one of the memory cells in the memory section 1 that corresponds to the internal address $A_0$ to $A_n$ is accessed.

In accordance with an address transition signal generated by the internal address transition detection circuit 6, the word line control circuit 7 and the plate line control circuit 8 drive a word line WL and a plate line PL of the memory section 1 in a mode corresponding to a control signal (not shown). Accordingly, the external address activation signal $\Phi_{EXA}$ becomes active during the usual accessing operation from the outside, and accessing operations in various modes are conducted for the memory cells in the memory section 1 in accordance with the external address $A_{EX0}$ to $A_{EXn}$ sent from the outside. When the refresh signal $\overline{RFSH}$ is active, the internal address activation signal $\Phi_{INA}$ becomes active, so that a refreshing operation is conducted for the memory cells in the memory section 1 that are in a DRAM-mode in accordance with the internal address $A_0$ to $A_n$, which is sequentially generated by the address counter 5.

Among the bits of the internal address $A_0$ to $A_n$, the most significant bit $A_n$ is input to a second counter 13 via a first counter 11 and an AND circuit 12. The output of the first counter 11 is coupled to the other input of the AND circuit 12. The counters 11 and 13 are circuits which conduct a counting in response to every fall of an input pulse and shift the output thereof from the low level to the high level upon finishing a predetermined number of counts. The internal count value is reset in either of the counters 11 and 13 and the output thereof is brought back to the low level when the internal refresh signal REF generated by the control signal generation circuit 10 is made inactive (i.e., the low level), that is, when the refresh signal $\overline{RFSH}$ is inactive (i.e., the high level), so that no refreshing operation is conducted. Accordingly, one counting is conducted in the first counter 11 every time the internal address $A_n$ falls, that is, every time all the bits of the internal address $A_0$ to $A_n$ have been output. As a result, the number of a series of refreshing operations conducted during an active period of the refresh signal $\overline{RFSH}$ is counted. The second counter 13 starts counting when the first counter 11, having counted a predetermined number of refreshing operations, outputs a signal at the high level. The second counter 13 counts the number of the times the internal address $A_n$ falls.

The output of the first counter 11 is coupled to a latch circuit 14. When the output of the first counter 11 is at the high level, the output of the latch circuit 14 is set at the high level. The output of the second counter 13 is coupled to the latch circuit 14 via an inverter circuit 15 and an AND circuit 16. To the other input of the AND circuit 16, the internal refresh signal REF is supplied. When the output of the AND circuit 16 is at the low level, the output of the latch circuit 14 is reset at the low level. Accordingly, the latch circuit 14 outputs a signal at the high level when the first counter 11 has counted a predetermined number of refreshing operations. This signal is maintained at the high level until the second counter 13 has counted a predetermined number of times that the internal address $A_n$ falls, or until the internal refresh signal REF becomes inactive (i.e., the low level).

The output of the latch circuit 14 is coupled to the plate line control circuit 8. The plate line control circuit 8 is set, from a mode where refreshing operations are conducted with the plate lines PL being maintained at 0 V, into a store-mode where the plate lines PL are driven by a voltage varying from 0 V to 5 V and back to 0 V. The plate lines PL of the plate line control circuit 8 being thus driven, the content stored in each memory cell, for which refreshing operations have been conducted, is sequentially stored in a non-volatile manner, in accordance with the internal address $A_0$ to $A_n$. This series of storing operations are continued until the second counter 13 has finished the predetermined number of counting. These storing operations may be conducted only once for each bit of the internal address $A_0$ to $A_n$. In the present example, however, storing operations are repeated up to the number set in the second counter 13 because conducting a plurality of storing operations can contribute to a secure storage of information as long as the maximum possible number of rewriting operations permits. By ensuring that the output of the data I/O interface of memory section 1 is in a high-impedance state during the storing operations, it becomes possible to connect a plurality of data outputs from the memory section 1 in a wired OR connection.

The output of the second counter 13 is also coupled to a timer stop latch circuit 17. When the output (corresponding to the store completion signal shown in FIG. 17) of the second counter 13 is at the high level, the output of the timer stop latch circuit 17 is set at the high level. The timer stop latch circuit 17 is reset, so that the output thereof returns the low level, when the internal refresh signal REF becomes inactive (i.e., the low level). The output of the timer stop latch circuit 17 is coupled to a recall requiring latch circuit 19 via an OR circuit 18. To the other input of the OR circuit 18, the initialization pulse signal PON is supplied. Receiving a high-level signal output from the OR circuit 18, the recall requiring latch circuit 19 is set so as to output a recall requiring signal $\overline{RC}$ at the low level via an output buffer 20 when the output of the timer stop latch circuit 17 is at the high level or when the initialization signal PON is at the high level due to the NVDRAM being turned on. The recall requiring latch circuit 19 is reset by a recall completion signal, which is output from a control circuit (not shown) that corresponds to the recall-mode timing control circuit 38 (shown in FIG. 2) when a recalling operation has finished, and outputs a refresh requiring signal RF at the high level via the output buffer 20. By adopting an open drain configuration for the output of the output buffer 20, it becomes possible to ensure that substantially no current is consumed unless the NVDRAM is accessed by external apparatuses.

The output of the timer stop latch circuit 17 is coupled also to a timer circuit 23 via an inverter 21 and an AND circuit 22. The timer circuit 23 generates a first clock signal $T_1$ having a long period (e.g. 16 µs) and a second clock signal $T_2$ having a short period (e.g. 1 µs) when the output of the AND circuit 22 is at the high level. In addition to the output of the inverter 21, the internal refresh signal REF generated by the control signal generation circuit 10 and a signal A, which is always at the high level, are supplied to the AND circuit 22. Accordingly, the timer circuit 23 generates the clock signals $T_1$ and $T_2$ only while the internal refresh signal REF is active (i.e., the high level) and the timer stop latch circuit 17, having been reset, is outputting an L-level signal. In other words, when the second counter 13 has finished a predetermined number of counting and outputs a high-level signal, the timer circuit 23 stops the generation of the clock signals $T_1$ and $T_2$.

The clock signals $T_1$ and $T_2$ generated by the timer circuit 23 are supplied to the address counter 5 via a selection circuit 24. The selection circuit 24 is a multiplexer for selecting one of the clock signals $T_1$ and $T_2$ and supplying the selected one of the clock signals to the address counter 5. The output of the latch circuit 14 is coupled to the control input of the selection circuit 24. The selection circuit 24 outputs the clock signal $T_1$ having a long period when the output of the latch circuit 14 is at the low level, and outputs the clock signal $T_2$ having a short period when the output of the latch circuit 14 is at the high level. Thus, during a refreshing operation, the address counter 5 generates the internal address $A_0$ to $A_n$ at a relatively low speed in accordance with the clock signal $T_1$ having a long period, so that the waste of power consumption due to excessive refreshing operations can be restrained. On the other hand, during a storing operation conducted after the first counter 11 has finished counting a predetermined number of refreshing operations, the address counter 5 generates the internal address $A_0$ to $A_n$ at a relatively high speed in accordance with the clock signal $T_2$ having a short period, so that the storing operation can be completed quickly. Under certain conditions, the clock signal $T_1$ may have a period equal to, or shorter than, that of the clock signal $T_2$.

Figure 9:
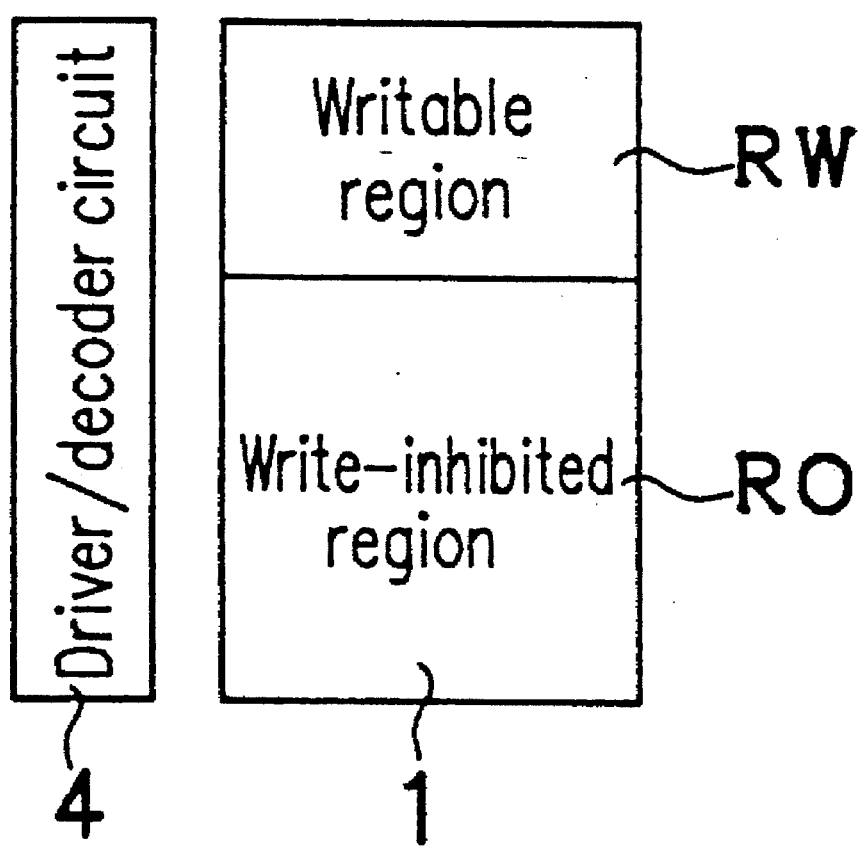
FIG. 9 is an address map showing a memory section according to Example 1 of the present invention.

With reference to FIG. 9, in cases where the address space of the memory section 1 is divided into a writable region RW, which is used like a RAM, and a write-inhibited (read only) region RO, which is used like a PROM, there may be a danger because a writing operation may erroneously be conducted for the write-inhibited region RO, thereby causing a program to have a run away. Since it would be convenient if such a danger can be avoided by hardware means, a write control circuit 25 is incorporated, as shown in FIG. 6, so as to prevent writing operations from being conducted for the write-inhibited region RO in the present example.

Figure 10:
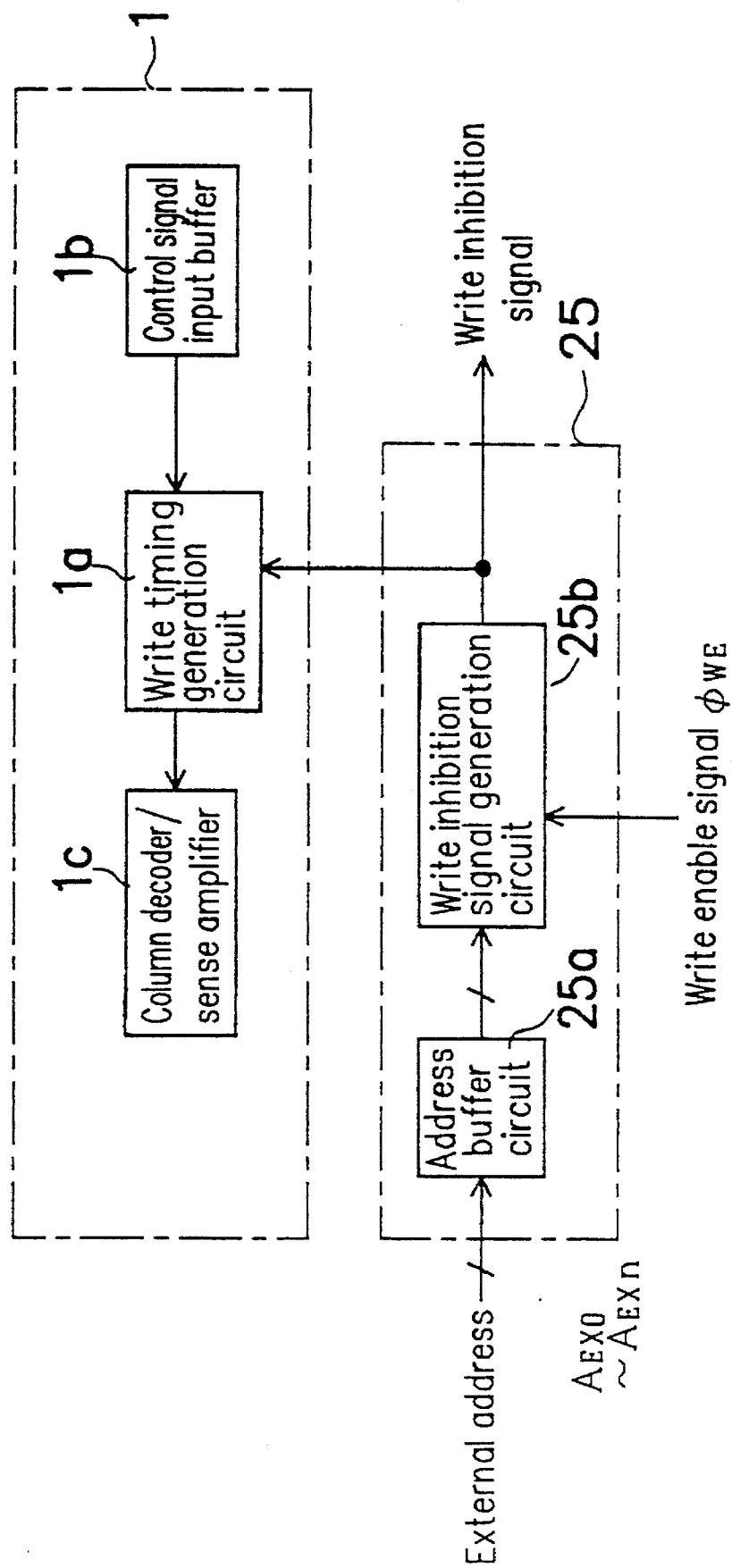
FIG. 10 is a block diagram showing a configuration for a write control circuit according to Example 1 of the present invention.

The external address $A_{EX0}$ to $A_{EXn}$ and a write enable signal $\Phi_{WE}$ are input to the write control circuit 25. The write control circuit 25 generates a write inhibition signal and supplies the write inhibition signal to the control input of the memory section 1. Specifically, as shown in FIG. 10, the write control circuit 25 includes an address buffer 25a and a write inhibition signal generation circuit 25b. The external address $A_{EX0}$ to $A_{EXn}$ is supplied to the write inhibition signal generation circuit 25b via the address buffer 25a. The write enable signal $\Phi_{WE}$ is input to the write inhibition signal generation circuit 25b.

Figure 11:
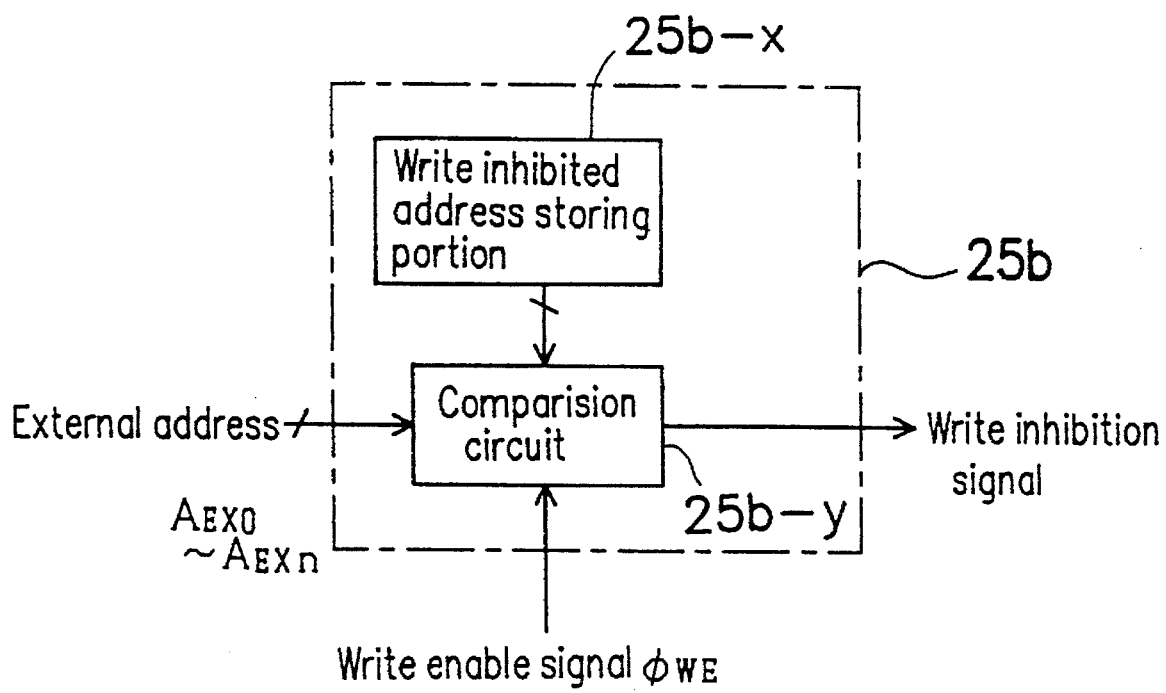
FIG. 11 is a block diagram showing a write inhibition signal generation circuit according to Example 1 of the present invention.

As shown in FIG. 11, the write inhibition signal generation circuit 25b includes a comparison circuit 25b-x and a write-inhibited address storing portion 25b-y. The write-inhibited address storing portion 25b-y stores information indicating the range of an address such that the comparison circuit 25b-x can detect whether or not the external address $A_{EX0}$ to $A_{EXn}$ lies within the write-inhibited region RO. When the write enable signal $\Phi_{WE}$ is active, indicating that a writing operation is to be conducted, the comparison circuit 25b-x conducts a comparison as to whether the external address $A_{EX0}$ to $A_{EXn}$ lies within the write-inhibited region RO based on the information stored in the write-inhibited address storing portion 25b-y. If the comparison circuit 25b-x detects that the external address $A_{EX0}$ to $A_{EXn}$ lies within the write-inhibited region RO, the comparison circuit 25b-x outputs an active write inhibition signal.

Figure 12:
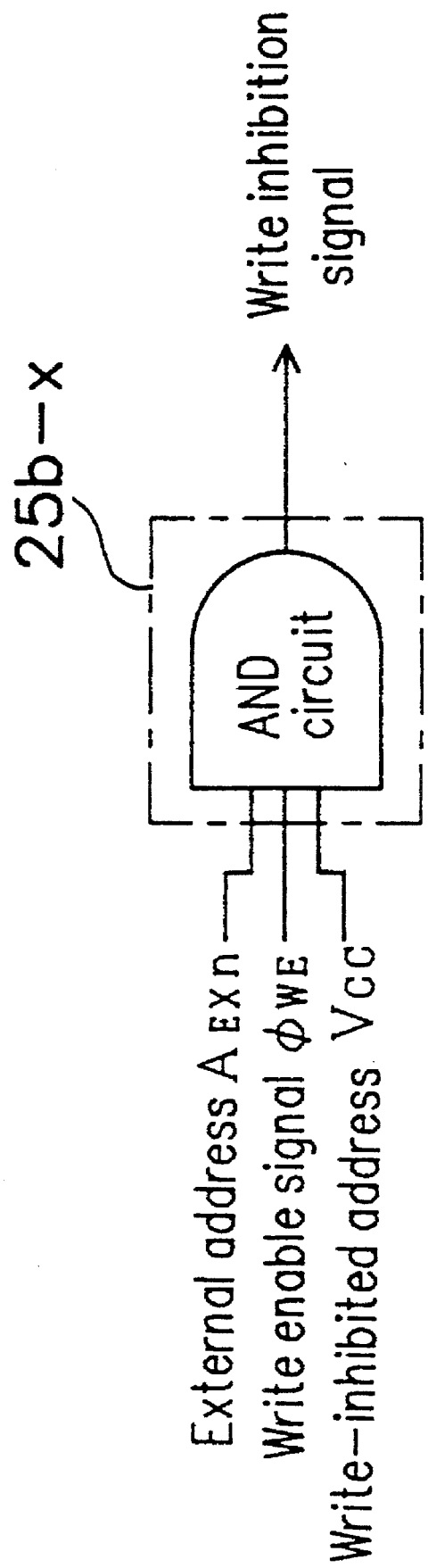
FIG. 12 is a block diagram showing a comparison circuit according to Example 1 of the present invention.

The comparison circuit 25b-x may be constituted by, for example, a single AND circuit shown in FIG. 12. To this AND circuit, the most significant bit $A_{EXn}$ of the external address $A_{EX0}$ to $A_{EXn}$, a supply voltage Vcc (i.e., the high level) indicating the write-inhibited address which is provided from the write-inhibited address storing portion 25b-y, and the write enable signal $\Phi_{WE}$ are supplied. In this case, the write inhibition signal becomes active (i.e., the high level) when the write enable signal $\Phi_{WE}$ is active (i.e., the high level) and the most significant bit $A_{EXn}$ of the external address $A_{EX0}$ to $A_{EXn}$ is also at the high level. As a result, the more significant half of all the bits of the address in the memory section 1 are set as the write-inhibited region RO.

Thus, the write inhibition signal output from the comparison circuit 25b-x is used as the output signal from the write inhibition signal generation circuit 25b and the write control circuit 25, and is supplied to a write timing generation circuit 1a in the memory section 1, as shown in FIG. 10. The write timing generation circuit 1a supplies a timing signal for a writing operation to a column decoder/ sense amplifier 1c in accordance with a control signal input via a control signal input buffer 1b. When the write inhibition signal from the write control circuit 25 becomes active, the write timing generation circuit 1a stops generating the timing signal, thereby inhibiting writing operations to the memory cells. The write inhibition signal can also be output to the outside of the NVDRAM so as to inform external equipments that a writing access has been made to the write-inhibited region RO.

However, at least one writing operation must be conducted for the write-inhibited region RO of the memory section 1 at the beginning. Therefore, it is necessary to incorporate a means into the control circuit 25 that prevents the write inhibition signal from becoming active even when the external address $A_{EX0}$ to $A_{EXn}$ is within the write-inhibited region RO. For example, the NVDRAM may be so configured that the write enable signal $\Phi_{WE}$, which is substantially a signal obtained by inverting a write enable signal $\overline{WE}$ input from the outside, can independently become inactive (i.e., the low level) even if the write enable signal $\overline{WE}$ is active (i.e., the low level), allowing this to occur only during such a forced writing. As a result, the write inhibition signal can be prevented from becoming active. In the case where the NVDRAM is realized as a separate memory device, the write enable signal $\Phi_{WE}$ may be supplied through an external terminal. In the case where the NVDRAM is realized as a memory module for a single chip microcomputer, the write enable signal $\Phi_{WE}$ may be supplied by means of a pad provided on the chip.

Hereinafter, an exemplary operation of the control section of an NVDRAM of above-mentioned configuration will be described with reference to the timing diagram shown in FIG. 13.

As described with reference to FIG. 6, the initialization pulse signal PON is at the high level when the NVDRAM is turned on, so that the internal address bits $A_0$ to $A_n$ are reset at their initial values, and that the recall requiring latch circuit 19 is set so as to output a recall requiring signal $\overline{RC}$ at the low level via the output buffer 20. Since the content stored in the memory cells in the DRAM-mode is destroyed by the time the NVDRAM is turned on, the above-mentioned recall requiring signal $\overline{RC}$ is output to external equipments or other internal modules. Since the refresh signal $\overline{RFSH}$ is inactive for a certain period of time after the NVDRAM is turned on, the internal refresh signal REF generated by the control signal generation circuit 10 is also inactive (i.e., the low level). As a result, the counters 11 and 13 and the timer stop latch circuit 17 is reset. The timer circuit 23 does not generate the clock signal $T_1$ or the clock signal $T_2$.

Figure 13:
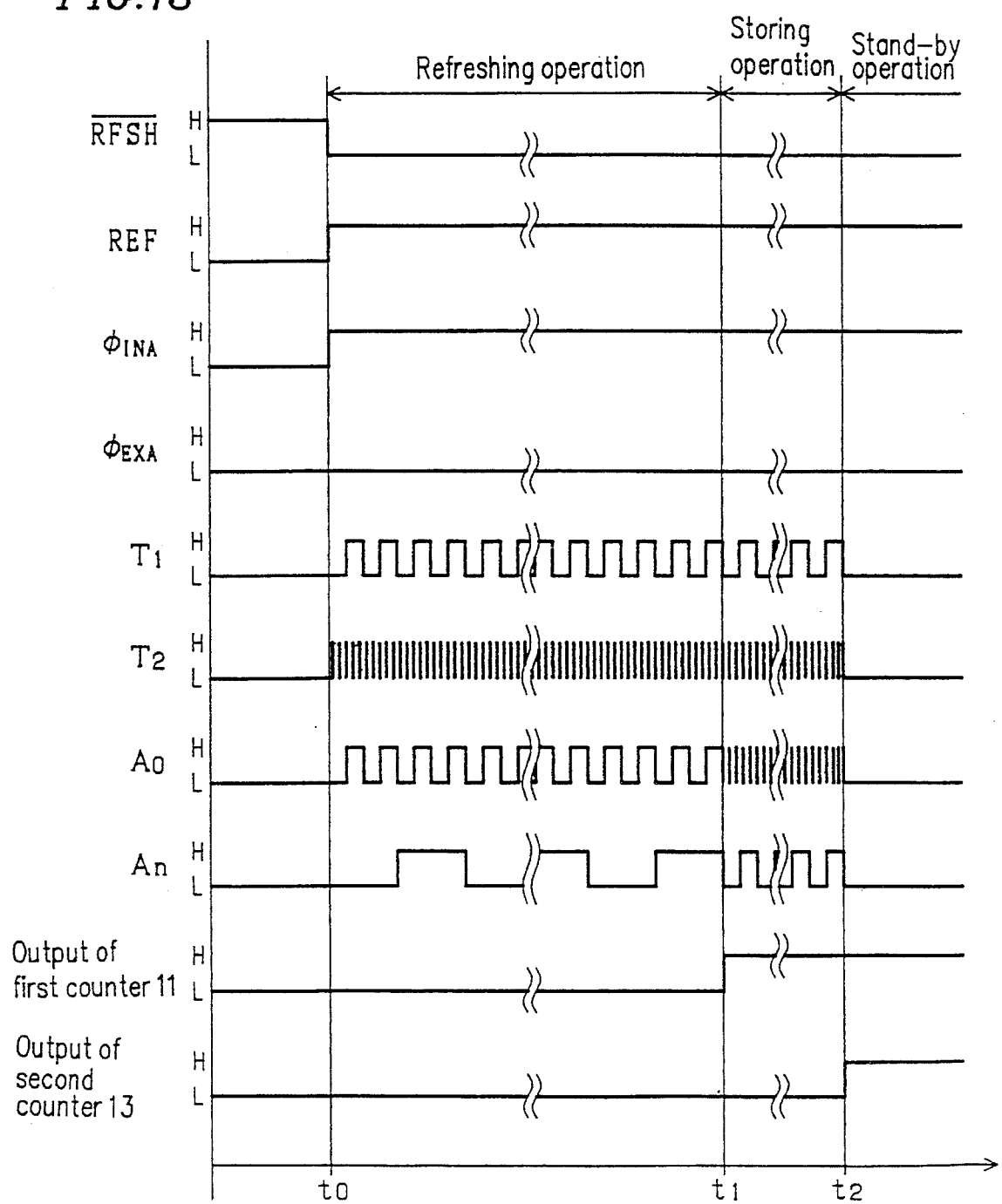
FIG. 13 is a timing diagram showing an operation of the NVDRAM according to Example 1 of the present invention.

Assuming that the refresh signal $\overline{RFSH}$ is made active (i.e., the low level) at time $t_0$ shown in FIG. 13, the internal refresh signal REF becomes active (i.e., the high level), and the internal address activation signal $\Phi_{INA}$ also becomes active (i.e., the high level). In FIG. 13, the external address activation signal $\Phi_{EXA}$ remains inactive (i.e., the low level) because external accessing operations are omitted from the explanation made herein with reference to FIG. 13.

When the internal refresh signal REF becomes active (i.e., the high level) as described above, the timer circuit 23 starts generating the clock signal $T_1$ having a long period and the clock signal $T_2$ having a short period, since the timer stop latch circuit 17 remains reset. The period of the clock signal $T_2$, although not clearly shown in FIG. 13, is one sixteenth (1/16) of the period of the clock signal $T_1$ in this example. Since the latch circuit 14 also remains reset in this exemplary case, the selection circuit 24 supplies the long-period clock signal $T_1$ to the address counter 5. Accordingly, the least significant bit $A_0$ of the internal address $A_0$ to $A_n$ generated by the address counter 5 varies with the same period of that of the clock signal $T_1$. The internal address $A_0$ to $A_n$ is supplied to the driver/decoder circuit 4 via the internal address transition detection circuit 6 and the address selection circuit 3. At the same time, the address transition of the internal address $A_0$ to $A_n$, which occurs in accordance with the change of the clock signal $T_1$, is detected by the internal address transition detection circuit 6, so as to drive the word line control circuit 7 and the plate line control circuit 8. As a result, refreshing operations are sequentially conducted for the respective memory cells of the memory section with the period of the clock signal $T_1$.

The most significant bit $A_n$ of the internal address $A_0$ to $A_n$ varies with an extremely long period, that is, a period obtained by dividing (double-fold) the least significant bit $A_0$ of the internal address n times. Although a value obtained by dividing the least significant bit $A_0$ of the internal address quadri-fold (i.e., n=2) is used as $A_n$ in FIG. 13 (in order to indicate the various signals therein by the same time scale), the actual internal address bit $A_n$ tends to have a much longer period. Every fall of the pulse of the internal address bit $A_n$ takes place at the end of all the internal address bits $A_0$ to $A_n$, that is, a series of refreshing operations have been completed for all the memory cells before every fall of the internal address bit $A_n$. Thus, the first counter 11 counts the number of refresh operations by counting the falls of the internal address bit $A_n$.

When the first counter 11 finishes counting a predetermined number of refreshing operations at time $t_1$, the output of the first counter 11 shifts to the high level. As a result, the latch circuit 14 is set, so that the selection circuit 24 starts supplying the short-period clock signal $T_2$ to the address counter 5, and the least significant internal address bit $A_0$ starts varying with the same period of that of the clock signal $T_2$. Moreover, when the latch circuit 14 is set, the plate line control circuit 8 is set so as to start activating a storing operation, so that the content which has been stored in each memory cell of the memory section 1 in a volatile manner and maintained by refreshing operations is re-stored in a non-volatile manner. Furthermore, the storing operation is conducted with the period of the clock signal $T_2$, which is shorter than that of the clock signal $T_1$, the series of storing operations for all the memory cells can be completed relatively quickly. The change of the internal address $A_n$ also occurs with a shorter period, every fall of whose pulse corresponds to the completion of the series of storing operations. The second counter 13 counts the number of storing operations by counting the falls of the internal address $A_n$.

When the second counter 13 finishes counting a predetermined number of storing operations at time $t_2$, the output of the second counter 13 shifts to the high level. As a result, the latch circuit 14 is set, so that the plate line control circuit 8 stops the storing operation, and the timer stop circuit 17 is set so that the timer circuit 23 stops the generation of the clock signals $T_1$ and $T_2$. As a result, the generation of the internal address $A_0$ to $A_n$ is also stopped. Accordingly, the NVDRAM is placed into a stand-by state, during which the NVDRAM waits until the refresh signal $\overline{RFSH}$ becomes inactive while consuming only a small amount of power without any refreshing operations being conducted. In this case, since the recall requiring latch circuit 19 is set so that a recall requiring signal $\overline{RC}$ at the low level is output via the output buffer 20, external equipments and other internal modules are informed that a next reading of the content stored in the memory cells must be conducted in a recall-mode, thereby facilitating the overall control.

When the refreshing signal $\overline{RFSH}$ becomes inactive again, the above-mentioned refreshing operation or storing operation is stopped. The internal refreshing signal REF becoming inactive, the counters 11 and 13 and the timer stop latch circuit 17 are reset so that the timer circuit 23 stops the generation of the clock signals $T_1$ and $T_2$. When the refresh signal $\overline{RFSH}$ becomes active once again, the operation from time $t_0$ is repeated, so as to start a refreshing operation.

Thus, the NVDRAM of the present invention has the following advantages: When refreshing operations are repeated by a predetermined number of times or more, the content stored in the memory cells of the memory section 1 in a volatile manner is automatically re-stored in a non-volatile manner through a storing operation, thereby eliminating the need for refreshing operations for any data which is not accessed for a long time. As a result, the power consumption of the NVDRAM is reduced. Moreover, during the storing operation, the internal address $A_0$ to $A_n$ is generated in accordance with a clock signal having a shorter period than that used for a refreshing operation, which makes for a quick switching from the volatile storage non-volatile storage. Moreover, a recall requiring signal $\overline{RC}$ is output to the outside of the NVDRAM when such an automatic storing operation has been conducted, thereby allowing external equipments and other internal modules to be informed that a next reading of the content stored in the memory cells must be conducted in a recall-mode.

In the case where the NVDRAM according to the present example is employed to substitute for RAMs and PROMs that are incorporated in a single chip microcomputer or other microcomputers designed for controlling purposes, the chip area and/or the circuit area of the substrate of such a microcomputer can be reduced because it is possible to utilize the same decoder circuit(s) and sense amplifier circuit(s) for the NVDRAM, whereas a combination of a RAM and a PROM would require at least one decoder circuit and/or a sense amplifier for each. Moreover, it is possible to incorporate the write-inhibited region RO in the memory section 1 by setting an address region to be used as a PROM in the write-inhibited address storing portion 25b–y of the write control circuit 25 so that a program or data can be protected from erroneous writing. By allowing the information to be stored in the write-inhibited address storing portion 25b–y to be programmable, it becomes possible to freely change the ratio between the writable region RW (equivalent to a RAM) and the write-inhibited region RO (equivalent to a PROM), thereby enabling one to construct an optimum address space without redundancy.

Figure 14:
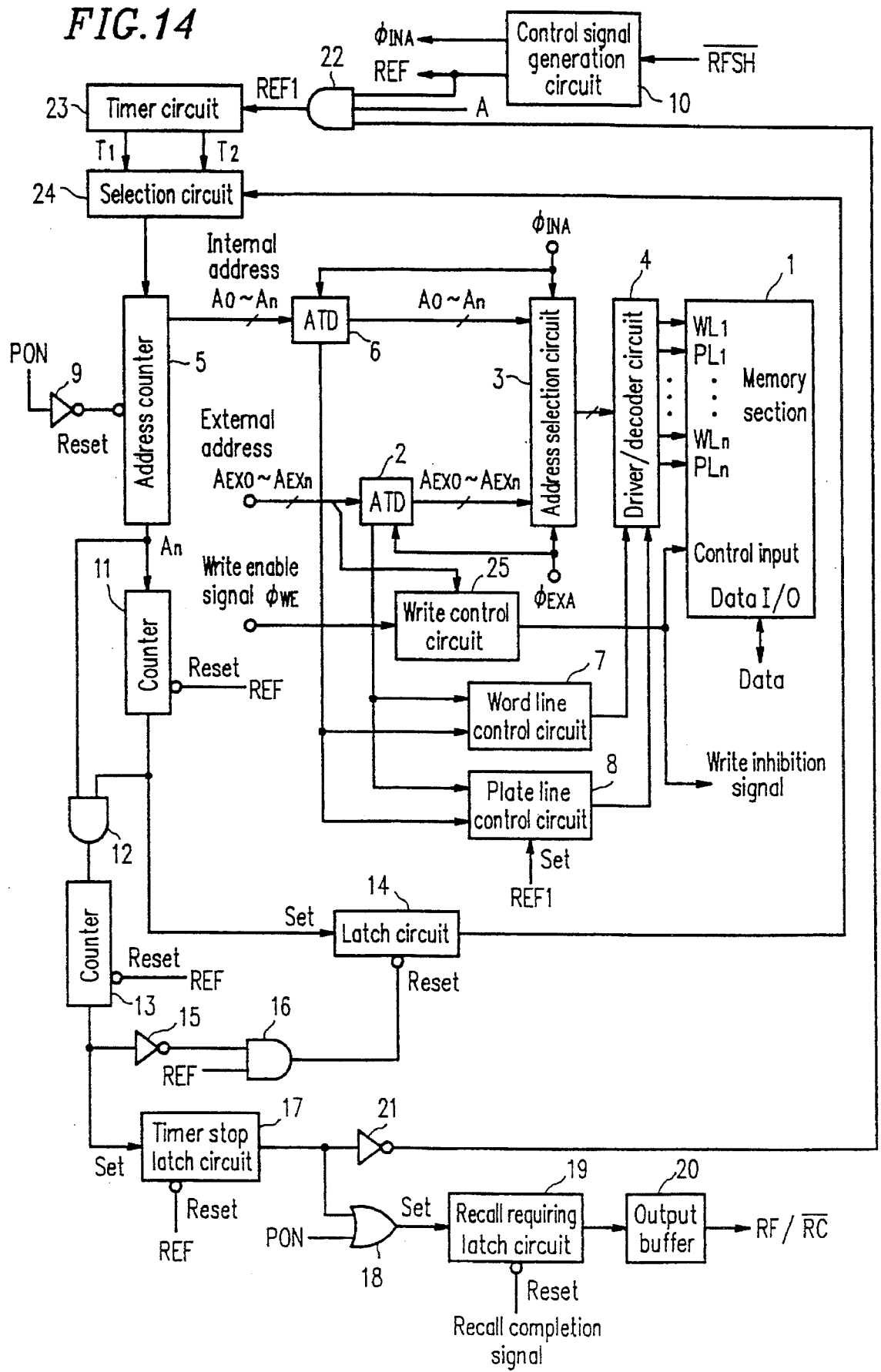
FIG. 14 is a block diagram showing a control section of a variant of the NVDRAM according to Example 1 of the present invention.
Figure 15:
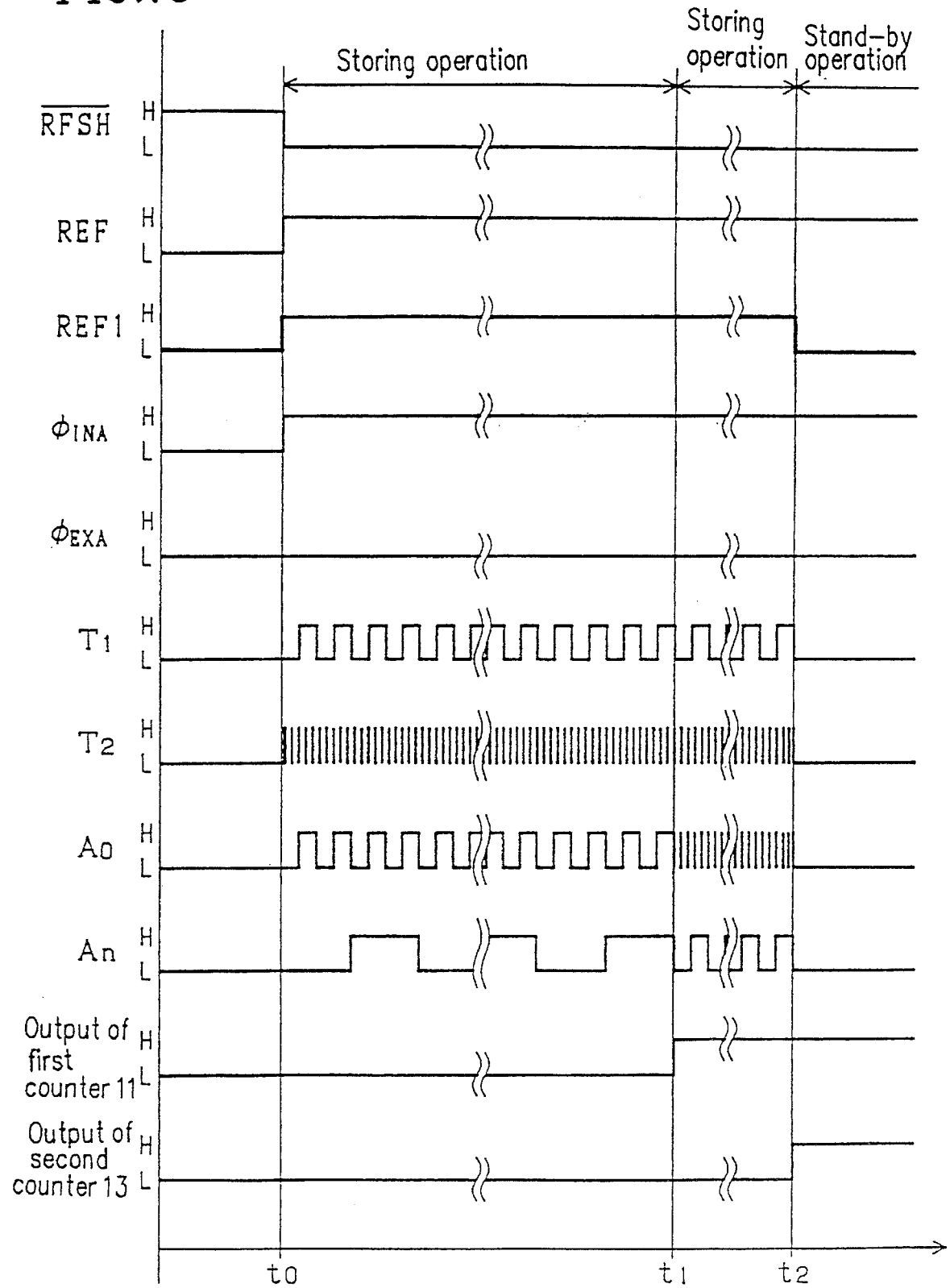
FIG. 15 is a timing diagram showing an operation of a variant of the NVDRAM according to Example 1 of the present invention.

A ferroelectric type NVDRAM only admits a limited number of rewriting operations in a non-volatile manner. However, if the NVDRAM is capable of being rewritten $10^8$ times, the NVDRAM is guaranteed an operational life of about 10 years, even assuming that the predetermined number of refreshing operations for the first counter 11 to count is so set as to take 1 second. If the NVDRAM is capable of being rewritten $10^{10}$ times, the NVDRAM is still guaranteed an operational life of about 10 years even by so prescribing that the predetermined number of refreshing operations for the first counter 11 to count is so set as to take 10 ms (milliseconds). Therefore, it is practical to control the NVDRAM in such a manner that any stored content is re-stored in a non-volatile manner as soon as the refresh signal $\overline{RFSH}$ becomes active (i.e., the low level). For example, if an NVDRAM capable of being rewritten $10^{10}$ times has 1000 word lines and the clock signal $T_1$ thereof has a period of 16 μs, each word line is selected every 16 ms, so that the NVDRAM is guaranteed an operational life of about 10 years. An NVDRAM shown in FIG. 14 (and 15) adopts such a configuration, where the output $REF_1$ of an AND circuit 22 is capable of setting a plate line control circuit 8. If the refresh signal $\overline{RFSH}$ becomes active (i.e., the low level), the output $REF_1$ of the AND circuit 22 shifts to the high level, and the plate line control circuit 8 is set, so that a storing operation is conducted within the same cycle that a refreshing operation for volatile data is conducted. If a second counter 13 finishes a predetermined number of counting at time $t_2$, the output of the second counter 13 shifts to the high level. Then, a timer stop latch circuit 17 is set, so that the timer circuit 23 stops the generation of the clock signals $T_1$ and $T_2$, thereby placing the NVDRAM into a stand-by state where the power consumption is reduced.

Figure 16:
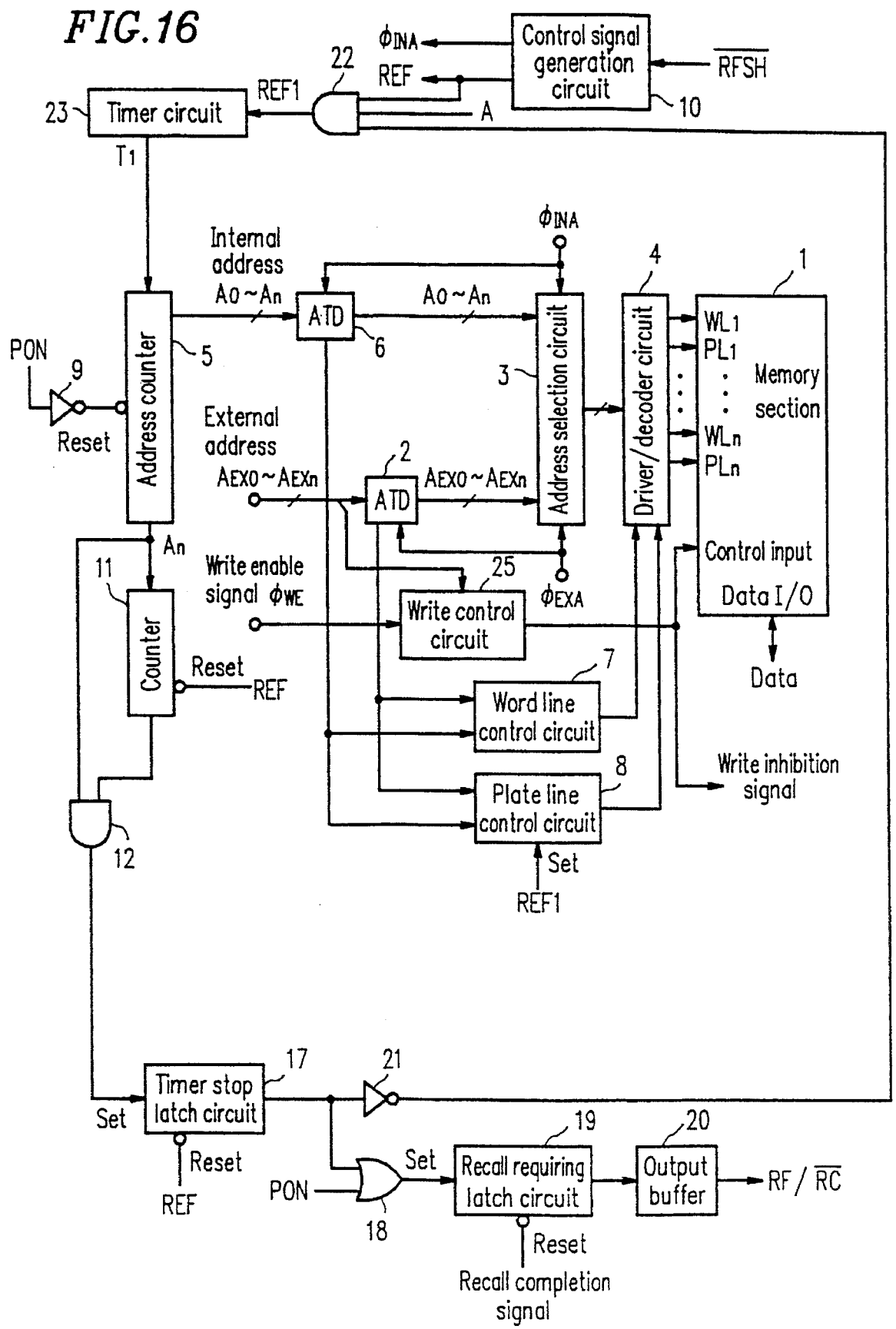
FIG. 16 is a block diagram showing a control section of a variant of the NVDRAM according to Example 1 of the present invention.

FIG. 16 shows another variant of the present example, where the storing operation period based on the clock signal $T_2$ is omitted (i.e., the counter 13 counts for a predetermined period of 0 seconds) since a refreshing operation and a storing operation of volatile data are conducted within the same cycle from time $t_0$ to time $t_1$.

Although an exemplary control for a ferroelectric type NVDRAM was described in the present example, the present invention is not limited to such a configuration. The present invention is also applicable to a DRAM/EEPROM type NVDRAM.

As will be apparent from the above description, an NVDRAM according to the present invention has the following advantages: When refreshing operations are repeated for a predetermined amount of time or longer, the content stored in the NVDRAM in a volatile manner is automatically switched to a non-volatile storage, thereby eliminating the need for refreshing operations for any data which is not accessed for a long time. As a result, the power consumption of the NVDRAM is reduced. Moreover, by switching the period of the clock signal, it becomes possible to conduct refreshing operations with only a small power consumption and to quickly switch to non-volatile storage. Moreover, by ensuring that a recall requiring signal is output to when such an automatic switching to non-volatile storage has been conducted, control from external equipments and the like can be facilitated. Moreover, no $\overline{NE}$ signal is required when performing a storing operation, which also facilitates the external control of the NVDRAM.

EXAMPLE 2

Example 2 relates to a ferroelectric type NVDRAM. In applications, this NVDRAM may be realized as a separate memory device or as a memory module for a single chip microcomputer.

Figure 17:
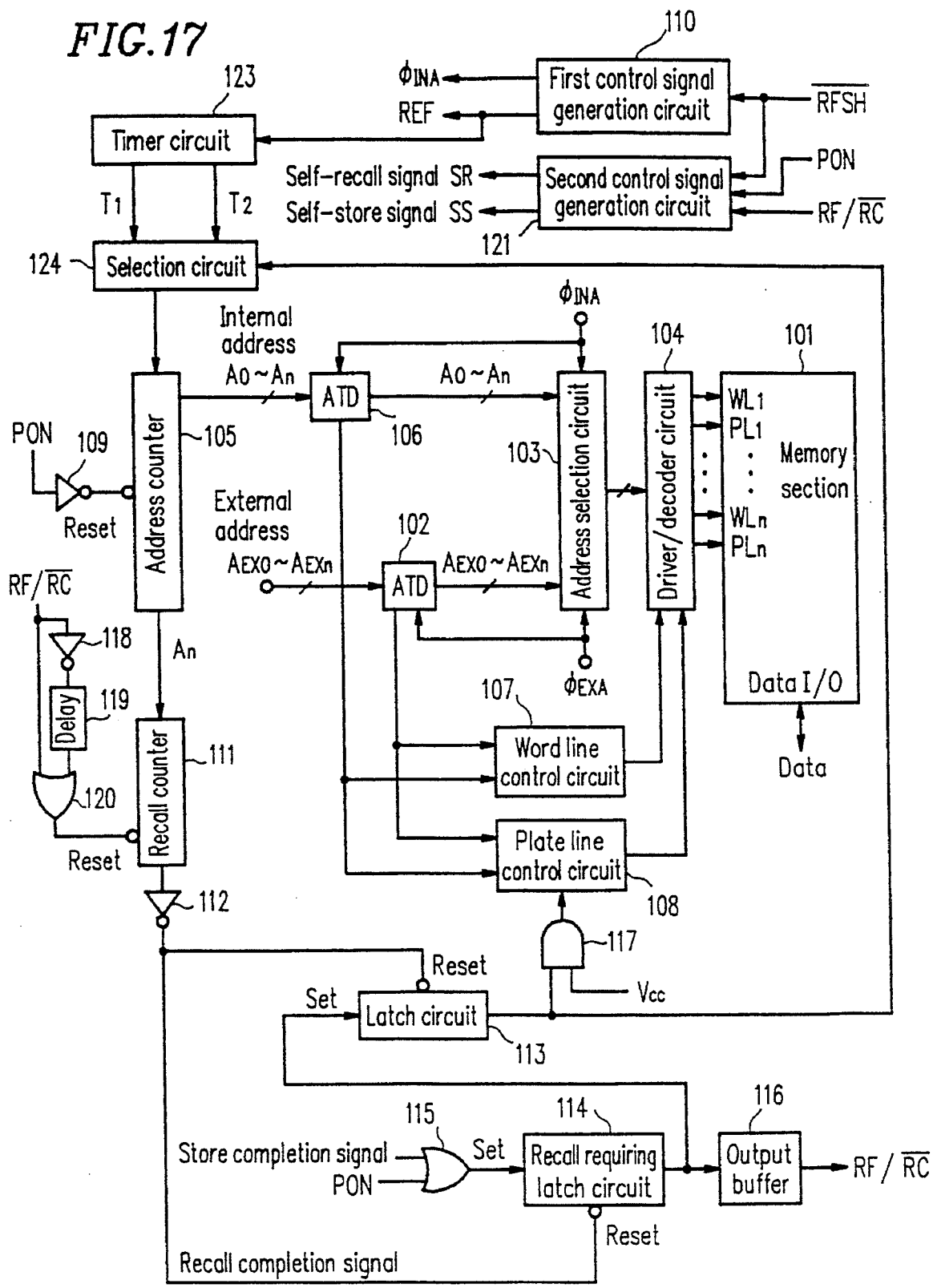
FIG. 17 is a block diagram showing a configuration for a control section of an NVDRAM according to Example 2 of the present invention.

FIG. 17 shows the NVDRAM according to Example 1, which includes a memory section 101. The memory section 101 includes a memory cell array, a sense amplifier, a data I/O interface, and the like. The memory cell array may, for example, consist of a plurality of memory cells 34 as shown in FIG. 2, the memory cells being of a two transistor/cell type. The memory cells may alternatively be of a one transistor/cell type.

As one variant of Example 2, the memory section 101 may alternatively be a memory in which a DRAM and an EEPROM are used in combination.

An external address $A_{EX0}$ to $A_{EXn}$, input from the outside, is sent to a driver/decoder circuit 104 via an external address transition detection circuit 102 and an address selection circuit 103. The NVDRAM also includes an address counter 105. The address counter 105 has a configuration shown in FIG. 7 (i.e. that of the address counter 5 in Example 1), and generates internal address $A_0$ to $A_n$.

As shown in FIG. 17, an initialization pulse signal PON is input to, as a reset signal (which is at the low level when it is active), the address counter 105. via an inverter circuit 109. The initialization pulse signal PON is set at the H (high) level when the NVDRAM is turned on. As a result of supplying the initialization pulse signal PON, the internal address bits $A_0$ to $A_n$ are reset at their initial values (where all bits are at the L (low) level). The internal address bits $A_0$ to $A_n$, output from the address counter 105, are input to the address selection circuit 103 via an internal address transition detection circuit 106.

The external address transition detection circuit 102 sends an external address $A_{EX0}$ to $A_{EXn}$ to the address selection circuit 103 when an external address activation signal $\Phi_{EXA}$ is active. The external address transition detection circuit 102 also detects, when the external address activation signal $\Phi_{EXA}$ is active, any change in the external address $A_{EX0}$ to $A_{EXn}$, and sends an address transition signal, which indicates the change in the external address $A_{EX0}$ to $A_{EXn}$, to a word line control circuit 107 and a plate line control circuit 108. The internal address transition detection circuit 106 sends internal address $A_0$ to $A_n$ to the address selection circuit 103 when an internal address activation signal $\Phi_{INA}$ is active. The internal address transition detection circuit 106 also detects any change in the internal address $A_0$ to $A_n$, and sends an address transition signal, which indicates the change in the internal address $A_0$ to $A_n$, to the word line control circuit 107 and the plate line control circuit 108. On receiving an address transition signal from the external address transition detection circuit 102 or the internal address transition detection circuit 106, the word line control circuit 107 controls the driver/decoder circuit 104 so as to drive a word line WL of the memory section 101. On receiving the address transition signal, the plate line control circuit 108 controls the driver/decoder circuit 104 so as to drive a plate line PL of the memory section 101.

The configuration for an input/output circuit in the address selection circuit 103 corresponding to one bit of an address is similar to that shown in FIG. 8 (i.e. the configuration of the input/output circuit of the address selection circuit 3 in Example 1).

The driver/decoder circuit 104 shown in FIG. 17 decodes an address sent from the address selection circuit 103. The driver/decoder circuit 104 selects and drives a corresponding one of the word lines WL and a corresponding one of the plate lines PL in the memory section 101 in accordance with the control made by the word line control circuit 107 and the plate line control circuit 108.

The internal address activation signal $\Phi_{INA}$ is a signal generated by a first control signal generation circuit 110, to which a refresh signal $\overline{RFSH}$ is input from the outside. The internal address activation signal $\Phi_{INA}$ is made active (i.e., the high level) when the refresh signal $\overline{RFSH}$ is active (i.e., the low level). The first control signal generation circuit 110 also generates an internal refresh signal REF obtained by inverting the refresh signal $\overline{RFSH}$. In the case where the NVDRAM is realized as a separate memory device, the refresh signal $\overline{RFSH}$ may be supplied through an external terminal. In the case where the NVDRAM is realized as a memory module for a single chip microcomputer, the refresh signal $\overline{RFSH}$ may be supplied by means of a pad provided on the chip. The external address activation signal $\Phi_{EXA}$ becomes active when an accessing operation is made from the outside, and is generated by a control circuit (not shown).

In accordance with the above-described configuration, when the external address activation signal $\Phi_{EXA}$ is active, the external address $A_{EX0}$ to $A_{EXn}$ is sent to the driver/decoder circuit 104 via the external address transition detection circuit 102 and the address selection circuit 103. As a result, one of the memory cells in the memory section 101 that corresponds to the external address $A_{EX0}$ to $A_{EXn}$ is accessed. In accordance with an address transition signal generated by the external address transition detection circuit 102, the word line control circuit 107 and the plate line control circuit 108 drive a word line WL and a plate line PL of the memory section 101 in a mode corresponding to a control signal (not shown). When the internal address activation signal $\Phi_{INA}$ is active, the internal address $A_0$ to $A_n$ is sent to the driver/decoder circuit 104 via the internal address transition detection circuit 106 and the address selection circuit 103. As a result, one of the memory cells in the memory section 101 that corresponds to the internal address $A_0$ to $A_n$ is accessed.

In accordance with an address transition signal generated by the internal address transition detection circuit 106, the word line control circuit 107 and the plate line control circuit 108 drive a word line WL and a plate line PL of the memory section 101 in a mode corresponding to a control signal (not shown). Accordingly, the external address activation signal $\Phi_{EXA}$ becomes active during a usual accessing operation from the outside, and accessing operations in various modes are conducted for the memory cells in the memory section 101 in accordance with the external address $A_{EX0}$ to $A_{EXn}$ sent from the outside. When the refresh signal $\overline{RFSH}$ is active, the internal address activation signal $\Phi_{INA}$ becomes active, so that a refreshing operation is conducted for the memory cells in the memory section 101 that are in accordance with the internal address $A_0$ to $A_n$, which is sequentially generated by the address counter 105.

Among the bits of the internal address $A_0$ to $A_n$, the most significant bit $A_n$ is input to a recall counter 111. The recall counter 111 counts every fall of the internal address bit $A_n$. The output of the recall counter 111 shifts from the low level to the high level when the recall counter 111 has counted a predetermined number of falls of the internal address bit $A_n$. Accordingly, one counting is conducted in the recall counter 111 every time all the bits of the internal address $A_0$ to $A_n$ have been output. The output of the recall counter 111 shifts to the high level when all the internal address bits $A_0$ to $A_n$ have been output a predetermined number of times. This predetermined number may be one.

The output of the recall counter 111 is coupled to a reset terminal (where the low level corresponds to the active state) of a latch circuit 113 and a recall requiring latch circuit 114 via an inverter circuit 112. In practice, the latch circuit 113 and the recall requiring latch circuit 114 consist essentially of RS flip-flop circuits. When the set terminal (where the high level corresponds to the active state) of the latch circuit 113 (the recall requiring latch circuit 114) is at the high level, the latch circuit 113 (the recall requiring latch circuit 114) is set so as to output a signal at the high level. When the reset terminal of the latch circuit 113 (the recall requiring latch circuit 114) is at the low level, the latch circuit 113 (the recall requiring latch circuit 114) is reset so as to output a signal at the low level. Accordingly, when the output of the recall counter 111 shifts to the high level, the outputs of the latch circuit 113 and the recall requiring latch circuit 114 are reset to the low level. Moreover, a store completion signal generated by a control circuit (not shown) when a storing operation has been completed and the initialization signal PON are input to the set terminal of the recall requiring latch circuit 114 via an OR circuit 115. Therefore, the recall requiring latch circuit 114 is set so as to output an signal at the high level when either of the store completion signal and the initialization signal PON shifts to the high level.

The output of the recall requiring latch circuit 114 is supplied to an output buffer 116. The output buffer 116 consists essentially of inverter circuits. The output buffer 116 outputs a recall requiring signal $\overline{RC}$ at the low level when the output of the recall requiring latch circuit 114 is at the high level, and outputs a refresh requiring signal RF at the high level when the output of the recall requiring latch circuit 114 is at the low level. The recall requiring signal $\overline{RC}$ and the refresh requiring signal RF are actually the same signal, that is, the same output signal of the output buffer 116 is expressed as the recall requiring signal $\overline{RC}$ when it is at the low level, and the refresh requiring signal RF when it is at the high level. Since the recall requiring signal $\overline{RC}$/refresh requiring signal RF is also output to the outside of the NVDRAM, external apparatuses and the like can easily be informed of the state of the NVDRAM of the present invention. By adopting an open drain configuration for the output of the output buffer 116, it becomes possible to ensure that substantially no current is consumed unless the NVDRAM is accessed by external apparatuses.

The output buffer 116 is merely a buffer circuit for outputting a de facto recall requiring signal output from the recall requiring latch circuit 114. The latch circuit 113 can be omitted by being integrated into the recall requiring latch circuit 114, since the latch circuit 113 is intended to latch the above-mentioned de facto recall requiring signal in synchronization with the recall requiring latch circuit 114.

The output of the recall requiring latch circuit 114 is also coupled to the set terminal of the latch circuit 113. As a result, when the output of the recall requiring latch circuit 114 is at the high level, the output of the latch circuit 113 is set at the high level. The output of the latch circuit 113 is supplied to the plate line control circuit 108 via an AND circuit 117. To another input of the AND circuit 117, a supply voltage Vcc is coupled. Accordingly, the output of the recall requiring latch circuit 114 is intactly supplied to the plate line control 108.

The plate line control circuit 108 is enabled when the output of the latch circuit 113 shifts to the high level. Herein, a recalling operation for recalling the non-volatile stored content is conducted by varying the voltage of the plate lines PL from 0 V to 5 V. Since a recalling operation for any content stored in a non-volatile manner results in a destructive reading, the content stored in a non-volatile manner is rewritten by varying the voltage of the plate lines PL from 0 V to 5 V and back to 0 V after the sense amplifier has been operated in this exemplary case.

The enabled state of the plate line control circuit 108 is terminated when the output of the latch circuit 13 shifts to the low level, and the plate lines PL are fixed at 0 V, for example, so that an access is made to content stored in a volatile manner. Accordingly, if the initialization signal PON or the store completion signal temporarily shifts to the high level in response to the turning on of the NVDRAM or the completion of a storing operation, the recall requiring latch circuit 114 and the latch circuit 113 are set, so that the plate line control circuit 108 becomes capable of performing a recalling operation for the memory cells of the memory section 101. When the recall counter 111 finishes the predetermined number of counts and recall requiring latch circuit 114 and the latch circuit 113 are reset, the plate line control circuit 108 becomes capable of accessing the content stored in the memory cells of the memory section 101 in a volatile manner.

The recall requiring signal $\overline{RC}$/refresh requiring signal RF output from the output buffer 116 is supplied to an OR circuit 120 both directly and via an inverter circuit 118 and a delay circuit 119. The output of the OR circuit 120 is supplied to the reset terminal (where the low level corresponds to the active state) of the recall counter 111. Accordingly, if the output of the output buffer 116 shifts from the refresh requiring signal RF (i.e., the high level) to the recall requiring signal $\overline{RC}$ (i.e., the low level), the internal count number in the recall counter 111 is reset before the delay time set in the delay circuit 119 passes, so that the output of the recall counter 111 is brought back to the low level.

Figure 18:
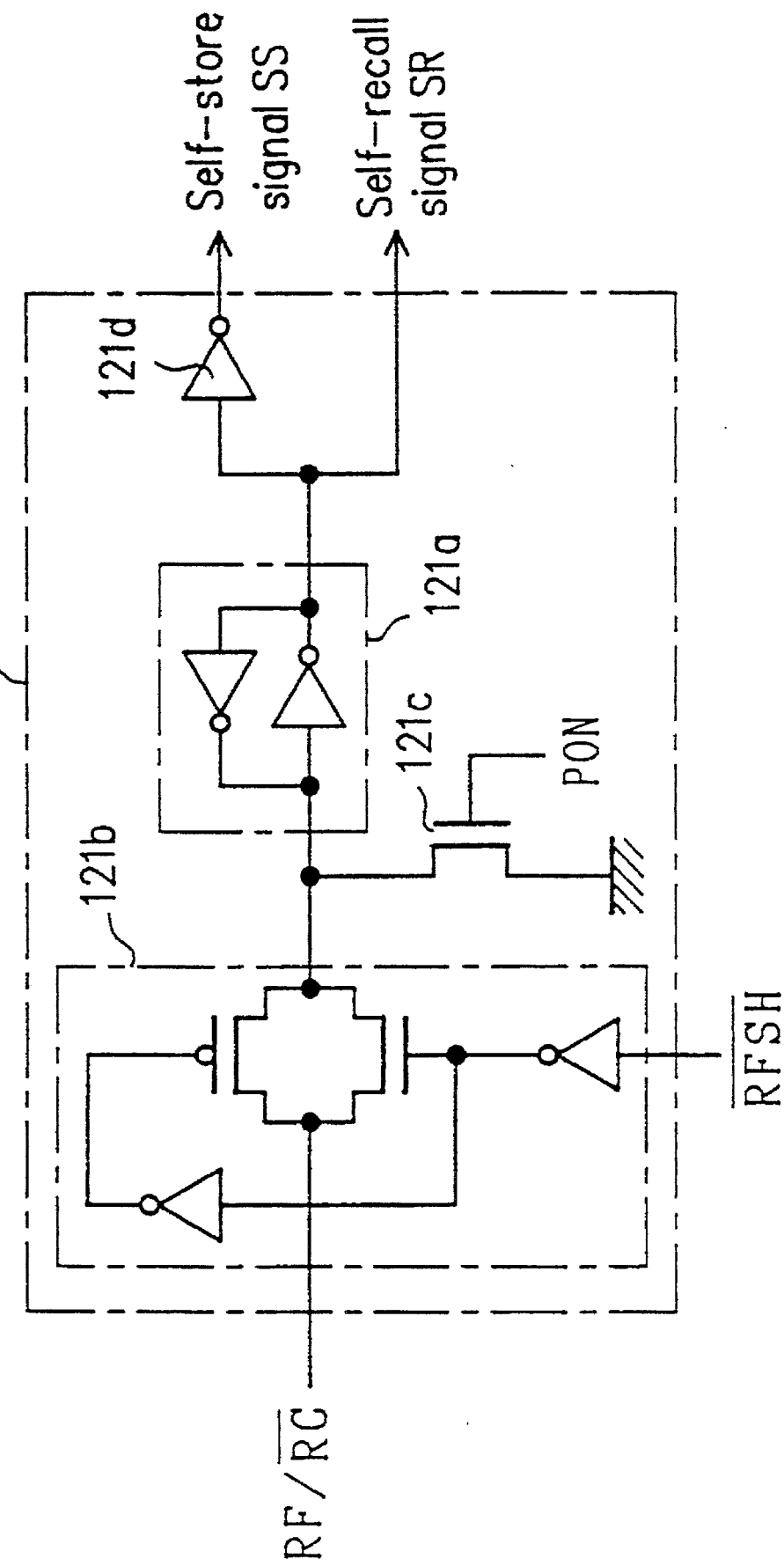
FIG. 18 is a block diagram showing a configuration for a second control signal generation circuit of the NVDRAM according to Example 2 of the present invention.

The recall requiring signal $\overline{RC}$/refresh requiring signal RF output from the output buffer 116 is also supplied to a second control signal generation circuit 121. The refresh signal $\overline{RFSH}$ and the initialization signal PON are also input to the second control signal generation circuit 121. As shown in FIG. 18, the second control signal generation circuit 121 consists essentially of a D type flip-flop (latch circuit) which in turn consists of a flip-flop circuit 121a and a gate circuit 121b. Specifically, the flip-flop circuit 121a is composed essentially of two inverter circuits. If the initialization signal PON temporarily shifts to the high level in response to the turning on of the NVDRAM, an N-channel FET 121c is turned on so that the output thereof is initialized at the high level. The gate circuit 121b is such that, when the refresh signal $\overline{RFSH}$ is active (i.e. the low level), the P-channel FET and the N-channel FET are turned on, so as to input the recall requiring signal $\overline{RC}$/refresh requiring signal RF to the flip-flop circuit 121a.

Accordingly, when the refresh signal $\overline{RFSH}$ becomes active, the flip-flop circuit 121a outputs a signal obtained by inverting the recall requiring signal $\overline{RC}$/refresh requiring signal RF. When the refresh signal $\overline{RFSH}$ becomes inactive again, the flip-flop circuit 121a continues outputting a signal obtained by inverting the recall requiring signal $\overline{RC}$/refresh requiring signal RF of the state immediately before the inactivation of the refresh signal $\overline{RFSH}$.

The output signal of the flip-flop circuit 121a is output as a self-recall signal SR from the second control signal generation circuit 121 as it is; the same output signal of the flip-flop circuit 121a is also inverted by the inverter circuit 121d so as to be output as a self-store signal SS. Accordingly, the self-recall signal SR is initialized at the high level when the NVDRAM is turned on, and shifts to the low level only when the refresh signal $\overline{RFSH}$ is active (i.e., the low level) and the refresh requiring signal RF (i.e., the high level) is output. The self-recall signal SR is equivalent to a signal obtained by inverting the self-store signal SS.

The internal refresh signal REF output from the first control signal generation circuit 110 is also supplied to a timer circuit 123. The timer circuit 123 oscillates only when the internal refresh signal REF is at the high level, and outputs a first clock signal $T_1$ having a long period (e.g., 16 μs) and a second clock signal $T_2$ having a short period (e.g., 500 ns).

The clock signals $T_1$ and $T_2$ generated by the timer circuit 123 are supplied to the address counter 105 via a selection circuit 124. The selection circuit 124 is a multiplexer which selects one of the clock signals $T_1$ and $T_2$ and supplies the selected clock signal to the address counter 105. The output of the latch circuit 113 is coupled to a control input of the selection circuit 124. The selection circuit 124 outputs the clock signal $T_1$ having a long period when the output of the latch circuit 113 is at the low level, and outputs the clock signal $T_2$ having a short period when the output of the latch circuit 113 is at the high level.

Hereinafter, an exemplary operation of the control section of an NVDRAM of above-mentioned configuration will be described with reference to the timing diagram shown in FIG. 19.

As described with reference to FIG. 17, the initialization pulse signal PON temporarily shifts the high level when the NVDRAM is turned on, so that the internal address bits $A_0$ to $A_n$ are reset at their initial values, and that the recall requiring latch circuit 114 is set so as to output a recall requiring signal $\overline{RC}$ at the low level via the output buffer 116. The latch circuit 113 is also set. If the recall requiring signal $\overline{RC}$ is output, the recall counter 111 is also reset before the delay time set in the delay circuit 119 passes. Since the refresh signal $\overline{RFSH}$ is inactive immediately after the NVDRAM is turned on, the internal refresh signal REF generated by the first control signal generation circuit 110 is also inactive (i.e., the low level), so that the timer circuit 123 does not generate the clock signals $T_1$ and $T_2$. The self-recall signal SR generated by the second control signal generation circuit 121 is initialized so as to be set at the high level.

Figure 19:
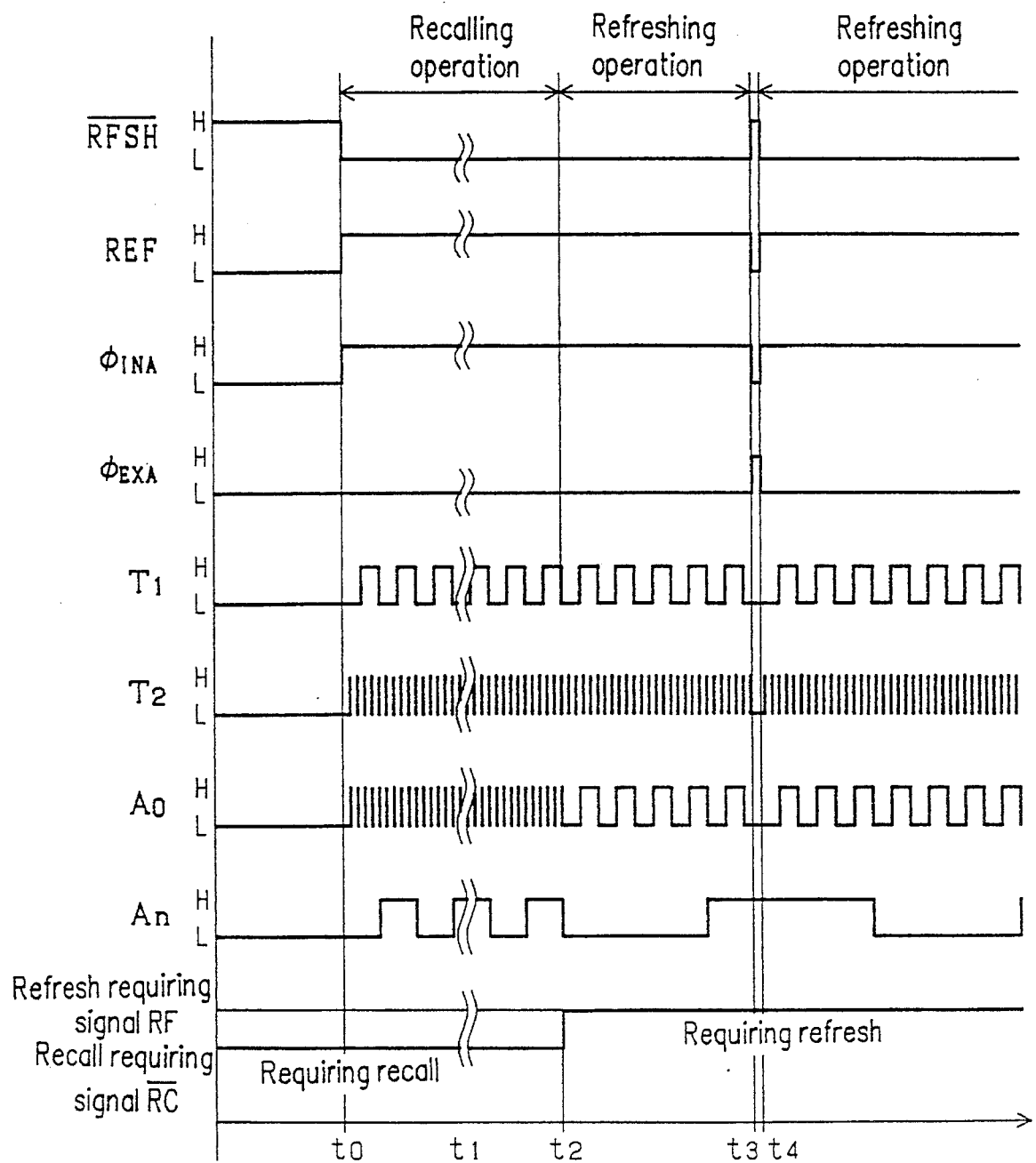
FIG. 19 is a timing diagram showing an operation of the NVDRAM according to Example 2 of the present invention.

Assuming that the refresh signal $\overline{RFSH}$ is made active (i.e., the low level) at time $t_0$ shown in FIG. 19, the internal refresh signal REF becomes active (i.e., the high level), and the internal address activation signal $\Phi_{INA}$ also becomes active (i.e., the high level).

When the internal refresh signal REF becomes active (i.e., the high level) as described above, the timer circuit 123 starts generating the clock signal $T_1$ having a long period and the clock signal $T_2$ having a short period. The period of the clock signal $T_2$, although not clearly shown in FIG. 19, is one thirty-seconds (1/32) of the period of the clock signal $T_1$ in this example (where the clock signal $T_1$ has a period of 16 μs and the clock signal $T_2$ has a period of 500 ns). Since the latch circuit 113 outputs a signal at the high level in this exemplary case, the selection circuit 124 supplies the short-period clock signal $T_2$ to the address counter 105. Accordingly, the least significant bit $A_0$ of the internal address $A_0$ to $A_n$ generated by the address counter 105 varies with the same period of that of the clock signal $T_2$. The internal address $A_0$ to $A_n$ is supplied to the driver/decoder circuit 104 via the internal address transition detection circuit 106 and the address selection circuit 103. At the same time, the address transition of the internal address $A_0$ to $A_n$, which occurs in accordance with the change of the clock signal $T_2$, is detected by the internal address transition detection circuit 106.

As a result, the word line control circuit 107 and the plate line control circuit 108 are driven, and the plate line control circuit 108 is enabled by the signal at the high level output from the latch circuit 113. Recalling operations are sequentially conducted for the respective memory cells of the memory section 101 with the period of the clock signal $T_2$. Hereinafter, this recalling operation will be referred to as a self-recalling operation.

The most significant bit $A_n$ of the internal address $A_0$ to $A_n$ varies with an extremely long period, that is, a period obtained by dividing (double-fold) the least significant bit $A_0$ of the internal address n times. Note that the internal address bit $A_n$ is shown to be shorter in FIG. 13 than it would actually be in order to indicate the various signals therein by the same time scale. Every fall of the pulse of the internal address bit $A_n$ takes place at the end of all the internal address bits $A_0$ to $A_n$, that is, a series of self-recalling operations have been completed for all the memory cells before every fall of the internal address bit $A_n$. Thus, the first counter 111 counts the number of self-recalling operations by counting the falls of the internal address bit $A_n$.

When the first counter 111 finishes counting a predetermined number of refreshing operations at time $t_2$, the latch circuit 113 and the recall requiring latch circuit 114 are reset so that the recall requiring signal $\overline{RC}$ shifts to a refresh requiring signal RF (i.e., the high level). As a result, the selection circuit 124 starts supplying the long-period clock signal $T_1$ to the address counter 105 instead of the short-period clock signal $T_2$, and the least significant internal address bit $A_0$ starts varying with the same period of that of the clock signal $T_1$. Moreover, the enabled state of the plate line control circuit 108 is terminated, so that the self-recalling operation is stopped and a refreshing operation for the content stored in a volatile manner is started. Since the refreshing operation as described herein is similar to the auto-refreshing and self-refreshing of a pseudo SRAM, such refreshing operations will hereinafter be referred to as self-refreshing operations. The self-recall signal SR output from the second control signal generation circuit 121 shifts to the low level, and the self-store signal SS shifts to the high level.

If the refresh signal $\overline{RFSH}$ is made inactive again at time $t_3$, after a self-refresh operation was started, the internal refresh signal REF also becomes inactive so that the timer circuit 123 stops oscillation and that the self-refresh operation is terminated. Moreover, the internal address activation signal $\Phi_{INA}$ also becomes inactive. As a result, if the external address activation signal $\Phi_{EXA}$ is made active by making at least one of a chip enable signal $\overline{CE}$, an output enable signal $\overline{OE}$, a write enable signal $\overline{WE}$, and the like active, the external address transition detection circuit 102 starts operating, and the address selection circuit 103 selects the addresses output from the external address transition detection circuit 102 and supplies the addresses to the driver/decoder circuit 104. Therefore, it becomes possible to access from the outside data that has been stored in a volatile manner. In order for external equipment to know that the self-recall operation has been completed at time $t_2$ and that the content stored in a volatile manner has become accessible, it is required to detect that the output from the output buffer 116 has shifted from the recall requiring signal $\overline{RC}$ to the refresh requiring signal RF.

When the refresh signal $\overline{RFSH}$ is made active at time $t_4$, an external accessing having been made, the internal refresh signal REF also becomes active so that the timer circuit 123 restarts oscillation, and that the internal address activation signal $\Phi_{INA}$ becomes active again. At the same time, the latch circuit 113 and the recall requiring latch circuit 114 are reset so as to output signals at the low level. Since the output signal of the output buffer 116 is still the refresh requiring signal RF, the self-refreshing operation is immediately restarted without a self-recalling operation being conducted.

If the refresh signal $\overline{RFSH}$ becomes inactive again during the self-recalling operation between time $t_0$ and time $t_2$, e.g., at time $t_1$, the timer circuit 123 stops oscillation, so that the self-recalling operation is suspended. However, the latch circuit 113 and the recall requiring latch circuit 114 are not reset yet but are outputting signals at the high level, and the output buffer 116 is still outputting the recall requiring signal $\overline{RC}$. As a result, the self-recalling operation is restarred when the refresh signal $\overline{RFSH}$ becomes active later, and the recall counter 111 continues counting from where it stopped the last time.

Thus, in accordance with the NVDRAM of the present example, a recall requiring signal $\overline{RC}$ is output when the NVDRAM is turned on or a storing operation has been completed. Accordingly, when the refresh signal $\overline{RFSH}$ becomes active for the first time after the recall requiring signal $\overline{RC}$ is output, a self-recalling operation is automatically performed so as to recall any data stored in a non-volatile manner and switch it to volatile storage, after which a self-refreshing operation can follow. Therefore, any device or circuit which accesses the NVDRAM of the present invention is capable of recalling the data stored in a non-volatile manner, switching it to volatile storage, and refreshing the data simply by controlling the refresh signal $\overline{RFSH}$. Thus, accessing the data stored in a volatile manner can be easily controlled.

Moreover, during a self-recalling operation, the internal address $A_0$ to $A_n$ is generated at a high speed in accordance with the short-period clock signal $T_2$, so that the recalling operation can be quickly completed. During a self-refreshing operation, on the other hand, the internal address $A_0$ to $A_n$ is generated at a low speed in accordance with the long-period clock signal $T_1$, so that the NVDRAM is prevented from conducting excessive refreshing operations, thereby preventing unnecessary power consumption. However, it is also applicable to prescribe the period of the clock signal $T_1$ to be equal to or even smaller than that of the clock signal $T_2$ under certain circumstances.

In accordance with the NVDRAM of Example 1, data stored in a volatile manner is saved as non-volatile data by conducting a self-storing operation when self-refreshing operations by an internal counter have continued longer than a predetermined amount of time, so that unnecessary power consumption due to excessive refreshing operations is prevented. The same effect can be also achieved in the present example by, when a self-recalling operation is terminated and a self-refreshing operation is started, using a counter (not shown) to count the amount of time that has passed with respect to a predetermined amount of time, so as to automatically conduct a self-storing operation accordingly. The self-recall signal SR and the self-store signal SS output by the second control signal generation circuit 121 can be used for controlling the self-recalling operations and self-storing operations in this manner. Specifically, such control should be made that the plate line control circuit 108, in an enabled state, performs a recalling operation when the self-recall signal SR is active, and that the plate line control circuit 108, in an enabled state, performs a storing operation when the self-store signal SS is active. Since circuitry for self-storing operations is likely to be applicable also for the circuitry for self-recalling operations according to the present example, the self-recall signal SR and the self-store signal SS can be used for controlling such circuitry having both functions.

In an NVDRAM according to the present invention in which the above-mentioned self-storing operation is additionally conducted, the self-recall signal SR becomes active when the refresh signal $\overline{RFSH}$ becomes active after the NVDRAM is turned on. As a result, a self-recalling operation is performed and then a self-refreshing operation is started, after which the self-store signal SS becomes active. That is, a self-storing operation is performed if the self-recalling operation is continued longer than a predetermined amount of time. Once a self-storing operation has been conducted, the NVDRAM is placed into a standby state, under which the NVDRAM consumes only a relatively small amount of power.

Alternatively, the second control signal generation circuit 121 can be constructed so that, instead of being a D-type flip-flop circuit, it latches the recall requiring signal $\overline{RC}$/refresh requiring signal RF only in response to a fall of the refresh signal $\overline{RFSH}$. Thus, the self-recall signal SR remains active when the refresh signal $\overline{RFSH}$ first becomes active, so that only a shift from a self-recalling operation to a self-refreshing operation takes place. However, if the refresh signal $\overline{RFSH}$ becomes active again after once becoming inactive, the self-store signal SS becomes active (instead of the self-recall signal SR), so that a self-storing operation will be performed when the self-refreshing operation has continued longer than predetermined amount of time.

The data I/O interface of the memory section 101 can be constructed by using a 3-status buffer. By controlling such a memory section 101 so that it is placed into a high impedance state during a self-recalling operation and a self-refreshing operation, it becomes possible to directly connect the data I/O interfaces of a number of such NVDRAMs.

EXAMPLE 3

Figure 20:
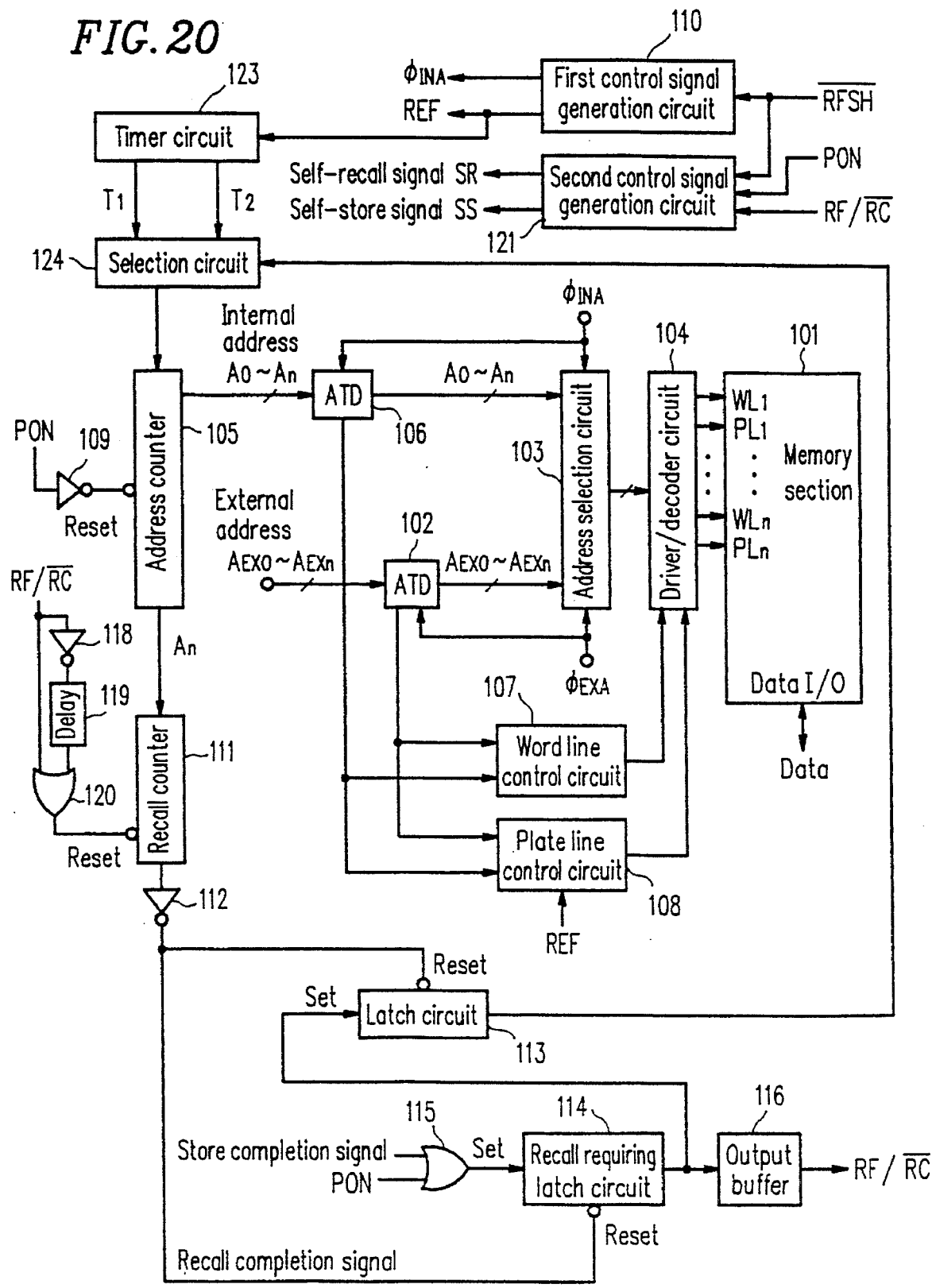
FIG. 20 is a block diagram showing a configuration for a control section of an NVDRAM according to Example 3 of the present invention.

FIG. 20 is a block diagram showing a control section of another example of an NVDRAM according to the present invention. Constituent elements having similar functions to the constituent elements of the NVDRAM of Example 2 (shown in FIG. 17) are indicated by similar reference numerals, descriptions thereof being omitted.

Although the output of the latch circuit 113 is supplied to the plate line control circuit 108 via the AND circuit 117 in Example 2, the NVDRAM of the present example is such that an internal refresh signal REF is directly supplied to a plate line control circuit 108, so that the plate line control circuit 108 is always enabled when the internal refresh signal REF is active. The mode of the plate line control circuit 108 is changed in accordance with a self-recall signal SR and a self-store signal SS that are output from a second control signal generation circuit 121 so that the plate line control circuit 108 performs a self-recalling operation when the self-recall signal SR is active and that the plate line control circuit 108 performs a self-refreshing operation for content stored in a volatile manner and a self-storing operation by varying the voltage of each plate line PL from 0 V to 5 V and back to 0 V within the same cycle.

According to the above-mentioned configuration, when the refresh signal $\overline{RFSH}$ becomes active, a self-recalling operation is performed and then a self-refreshing operation is started. In the present example, however, a self-storing operation for the content stored in a non-volatile manner is conducted concurrently with the self-refreshing operation. Therefore, the NVDRAM of the present example has the advantage that refreshing for both the content stored in a volatile manner and the content stored in a non-volatile manner can be performed at the same time. However, such refreshing for the non-volatile storage is bound by the limits of the number of polarization inversion that a ferroelectric material used in the NVDRAM can perform. If the ferroelectric material permits $10^{10}$ or more polarization inversions, it becomes possible to guarantee that the NVDRAM will operate over a period of 10 years or more by so prescribing the refresh period that each memory cell is selected with a period of about 10 ms or more. For example, if the NVDRAM has 1000 word lines WL and the clock signal $T_1$ thereof has a period of 16 μs, each memory cell is refreshed with a period of 16 ms, so that the NVDRAM is guaranteed an operational life of 10 years or more.

Although the present example described a case where control similar to that made for a pseudo SRAM is conducted by using a refresh signal $\overline{RFSH}$ for controlling the self-refreshing operations, it is also applicable to control the self-refreshing operations by using a combination of a plurality of control signals, such as the $\overline{CAS}$ signal and $\overline{RAS}$ signal used for a $\overline{CAS}$-before-$\overline{RAS}$ refresh type DRAM. In this case, the addresses are multiplexed before being input, so that the entire package can be miniaturized, thereby improving the mounting density using the NVDRAM.

Moreover, the NVDRAM according to the present example can be commonly employed to substitute for RAMs and PROMs incorporated in a single chip microcomputer or the like, in which case the chip area and/or the circuit area of the substrate of the microcomputer can be reduced.

As described above, in accordance with the NVDRAM according to the present invention, any content stored in a non-volatile manner can be recalled into volatile storage and refreshed simply by controlling the refresh signal. Therefore, the accessing operations to the volatile storage can be easily controlled.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An NVDRAM comprising:

volatile memory cells which require a refreshing operation for retaining content stored therein;

non-volatile memory cells which permit content stored therein to be rewritten;

address generation means for automatically generating in sequence respective addresses of the volatile memory cells and the non-volatile memory cells in accordance with a clock signal;

self-refresh means for performing the refreshing operation by sequentially rewriting the content stored in each volatile memory cell based on the addresses generated by the address generation means;

refresh timing means for measuring a duration for which the self-refresh means continually performs the refreshing operation;

self-store starting means for determining whether or not duration of the refreshing operation as measured by the refresh timing means has exceeded a predetermined time amount; and self-store means for, when the self-store starting means determines that the duration of the refreshing operation as measured by the refresh timing means has exceeded the predetermined time amount, stopping the refreshing operation by the self-refresh means and for performing a storing operation by sequentially transferring the content stored in the volatile memory cells to the non-volatile memory cells to be stored therein based on the addresses generated by the address generation means.

2. An NVDRAM according to claim 1 further comprising:

clock signal supplying means for supplying two clock signals to be used for automatically generating the addresses, the clock signals having different periods from each other; and clock signal switching means for ensuring that the clock signal supplying means supplies a clock signal having a longer period when the self-refresh means performs the refreshing operation and that the clock signal supplying means supplies a clock signal having a shorter period when the self-store means performs the storing operation.

3. An NVDRAM according to claim 1 further comprising recall requiring signal generation means for generating a recall requiring signal for requiring a recalling operation, when the self-store means has performed the storing operation, so as to recall the content stored in the non-volatile memory cells.

4. An NVDRAM comprising:

memory cells having a volatile storage function which requires a refreshing operation for retaining content stored in the memory cells and a non-volatile storage function which permits content stored in the memory cells to be rewritten;

address generation means for automatically generating in sequence respective addresses of the memory cells in accordance with a clock signal;

self-refresh means for performing the refreshing operation by sequentially rewriting the content that is stored in each memory cell in a volatile manner based on the addresses generated by the address generation means;

refresh timing means for measuring a duration for which the self-refresh means continually performs the refreshing operation;

self-store starting means for determining whether or not duration of the refreshing operation as measured by the refresh timing means has exceeded a predetermined time amount; and self-store means for, when the self-store starting means determines that the duration of the refreshing operation as measured by the refresh timing means has exceeded the predetermined time amount, stopping the refreshing operation by the self-refresh means and for performing a storing operation in which the content that is stored in the memory cells in a volatile manner is sequentially re-stored in the same memory cells in a non-volatile manner based on the addresses generated by the address generation means.

5. An NVDRAM according to claim 4 further comprising:

clock signal supplying means for supplying two clock signals to be used for automatically generating the addresses, the clock signals having different periods from each other; and clock signal switching means for ensuring that the clock signal supplying means supplies a clock signal having a longer period when the self-refresh means performs the refreshing operation and that the clock signal supplying means supplies a clock signal having a shorter period when the self-store means performs the storing operation.

6. An NVDRAM according to claim 4 further comprising recall requiring signal generation means for generating a recall requiring signal for requiring a recalling operation, when the self-store means has performed the storing operation, so as to recall the content stored in the memory cells in a non-volatile manner.

7. An NVDRAM comprising:

volatile memory cells which require a refreshing operation for retaining content stored therein;

non-volatile memory cells which permit content stored therein to be rewritten;

address generation means for automatically generating in sequence respective addresses of the volatile memory cells and the non-volatile memory cells in accordance with a clock signal;

self-store means for performing the refreshing operation by sequentially rewriting the content stored in each volatile memory cell and for performing a storing operation by transferring the content stored in the volatile memory cells to the non-volatile memory cells to be stored therein based on the addresses generated by the address generation means;

self-store timing means for measuring a duration for which the self-store means continually performs the storing operation;

means for determining whether or not the duration of the storing operation as measured by the self-store timing means has exceeded a predetermined time amount; and means for, when the duration of the refreshing operation as measured by the self-store timing means is determined to have exceeded the predetermined time amount, stopping the refreshing operation and the storing operation by the self-store means.

8. An NVDRAM according to claim 7 further comprising recall requiring signal generation means for generating a recall requiring signal for requiring a recalling operation, when the self-store means has performed the storing operation, so as to recall the content stored in the non-volatile memory cells.

9. An NVDRAM comprising:

memory cells having a volatile storage function which requires a refreshing operation for retaining content stored in the memory cells and a non-volatile storage function which permits content stored in the memory cells to be rewritten;

address generation means for automatically generating in sequence respective addresses of the memory cells in accordance with a clock signal;

self-store means for performing the refreshing operation by sequentially rewriting the content that is stored in each memory cell in a volatile manner and for performing a storing operation in which the content that is stored in a volatile manner is sequentially re-stored in a non-volatile manner based on the addresses generated by the address generation means;

self-store timing means for measuring a duration for which the self-store means continually performs the storing operation;

means for determining whether or not the duration of the storing operation as measured by the self-store timing means has exceeded a predetermined time amount; and means for, when the duration of the refreshing operation as measured by the self-store timing means is determined to have exceeded the predetermined time amount, stopping the refreshing operation and the storing operation by the self-store means.

10. An NVDRAM according to claim 9 further comprising recall requiring signal generation means for generating a recall requiring signal for requiring a recalling operation, when the self-store means has performed the storing operation, so as to recall the content stored in the memory cells in the non-volatile manner.

11. An NVDRAM comprising:

memory cells having a volatile storage function which requires a refreshing operation for retaining content stored in the memory cells and a non-volatile storage function which permits content stored in the memory cells to be rewritten;

refresh signal input means for receiving a refresh signal;

recall requiring signal generation means for generating a recall requiring signal;

address generation means for automatically generating in sequence respective addresses of the memory cells in accordance with a clock signal;

recall means for, when the refresh signal is input to the refresh signal input means and the recall requiring signal generation means is generating the recall requiring signal, performing a recalling operation in which the content that is stored in the memory cells in a non-volatile manner is sequentially re-stored in the same memory cells in a volatile manner based on the addresses generated by the address generation means;

recalling operation control means for terminating the generation of the recall requiring signal by the recall requiring signal generation means when the recall means has performed the recalling operation a predetermined number of times; and refresh means for performing the refreshing operation by, when the refresh signal is input to the refresh signal input means and the recall requiring signal generation means is not generating the recall requiring signal, sequentially rewriting the content that is stored in each memory cell in the volatile manner based on the addresses generated by the address generation means.

12. An NVDRAM according to claim 11, wherein each of the memory cells comprises a capacitor element in which a ferroelectric material is interposed.

13. An NVDRAM according to claim 11 further comprising refresh signal generation means for generating the refresh signal from a point of time when a $\overline{RAS}$ signal becomes active after a $\overline{CAS}$ signal becomes active, until a point of time when the $\overline{RAS}$ signal becomes inactive after the $\overline{CAS}$ signal becomes inactive.

14. An NVDRAM according to claim 11 further comprising:

clock signal supplying means for supplying two clock signals to be used for the automatic generation of the addresses, the clock signals having different periods from each other; and clock signal switching means for ensuring that the clock signal supplying means supplies a clock signal having a shorter period when the recall means performs the recalling operation and that the clock signal supplying means supplies a clock signal having a longer period when the refresh means performs the refreshing operation.

15. An NVDRAM according to claim 11, wherein the refresh means performs the refreshing operation by sequentially rewriting the content that is stored in each memory cell in the volatile manner based on the addresses generated by the address generation means, and performs a storing operation so as to re-store the content that is stored in the volatile manner in the same memory cell in the non-volatile manner concurrently with the refreshing operation for the memory cells.

16. An NVDRAM comprising:

volatile memory cells which require a refreshing operation for retaining content stored therein;

non-volatile memory cells which permit content stored therein to be rewritten;

refresh signal input means for receiving a refresh signal;

recall requiring signal generation means for generating a recall requiring signal;

address generation means for automatically generating in sequence respective addresses of the memory cells in accordance with a clock signal;

recall means for, when the refresh signal is input to the refresh signal input means and the recall requiring signal generation means is generating the recall requiring signal, performing a recalling operation in which sequentially recalling the content stored in the non-volatile memory cells into the volatile memory cells based on the addresses generated by the address generation means;

recalling operation control means for terminating the generation of the recall requiring signal by the recall requiring signal generation means when the recall means has performed the recalling operation a predetermined number of times; and refresh means for performing a refreshing operation by, when the refresh signal is input to the refresh signal input means and the recall requiring signal generation means is not generating the recall requiring signal, sequentially rewriting the content stored in the volatile memory cells based on the addresses generated by the address generation means.

17. An NVDRAM according to claim 16, wherein the volatile memory cells are composed essentially of DRAMs and the non-volatile memory cells are composed essentially of EEPROMs.

18. An NVDRAM according to claim 16 further comprising refresh signal generation means for generating the refresh signal from a point of time when a $\overline{RAS}$ signal becomes active after a $\overline{CAS}$ signal becomes active, until a point of time when the $\overline{RAS}$ signal becomes inactive after the $\overline{CAS}$ signal becomes inactive.

19. An NVDRAM according to claim 16 further comprising:

clock signal supplying means for supplying two clock signals to be used for automatically generating the addresses, the clock signals having different periods from each other; and clock signal switching means for ensuring that the clock signal supplying means supplies a clock signal having a shorter period when the recall means performs the recalling operation and that the clock signal supplying means supplies a clock signal having a longer period when the refresh means performs the refreshing operation.

20. An NVDRAM according to claim 16, wherein the refresh means performs the refreshing operation by sequentially rewriting the content that is stored in each of the volatile memory cells based on the addresses generated by the address generation means, and performs a storing operation so as to re-store the content that is stored in the each of the volatile memory cells in the non-volatile memory cells concurrently with the refreshing operation for the volatile memory cells.

* * * * *